(12) United States Patent
Zhang et al.

(10) Patent No.: US 10,768,738 B1
(45) Date of Patent: Sep. 8, 2020

(54) ELECTRONIC DEVICE HAVING A HAPTIC ACTUATOR WITH MAGNETIC AUGMENTATION

(71) Applicant: Apple Inc., Cupertino, CA (US)

(72) Inventors: Zhipeng Zhang, Santa Clara, CA (US); Richard H. Koch, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 42 days.

(21) Appl. No.: 15/717,543

(22) Filed: Sep. 27, 2017

(51) Int. Cl.
| | |
|---|---|
| *G06F 3/01* | (2006.01) |
| *G06F 3/041* | (2006.01) |
| *H01L 41/04* | (2006.01) |
| *H01L 41/09* | (2006.01) |
| *B06B 1/06* | (2006.01) |
| *B06B 1/04* | (2006.01) |

(52) U.S. Cl.
CPC .............. *G06F 3/0414* (2013.01); *B06B 1/04* (2013.01); *B06B 1/0603* (2013.01); *G06F 3/016* (2013.01); *G06F 3/0412* (2013.01); *H01L 41/042* (2013.01); *H01L 41/094* (2013.01)

(58) Field of Classification Search
CPC ........ G06F 3/016; G06F 3/041; G06F 3/0412; B06B 1/04; B06B 1/0603; B06B 1/0688; B06B 1/0607; H01L 41/094; H01L 41/042
See application file for complete search history.

(56) References Cited

U.S. PATENT DOCUMENTS

| | | | |
|---|---|---|---|
| 5,196,745 A | 3/1993 | Trumper et al. | |
| 5,293,161 A | 3/1994 | MacDonald et al. | |
| 5,424,756 A | 6/1995 | Ho et al. | |
| 5,434,549 A | 7/1995 | Hirabayashi et al. | |
| 5,436,622 A | 7/1995 | Gutman et al. | |
| 5,668,423 A | 9/1997 | You et al. | |

(Continued)

FOREIGN PATENT DOCUMENTS

| | | |
|---|---|---|
| CN | 101036105 | 9/2007 |
| CN | 201044066 | 4/2008 |

(Continued)

OTHER PUBLICATIONS

Author Unknown, "3D Printed Mini Haptic Actuator, Autodesk, Inc., 16 pages, 2016."

(Continued)

*Primary Examiner* — Alexander Eisen
*Assistant Examiner* — Cory A Almeida
(74) *Attorney, Agent, or Firm* — Brownstein Hyatt Farber Schreck, LLP

(57) ABSTRACT

Disclosed herein are electronic devices having piezoelectric haptic actuators to generate haptic output. The haptic actuators can be configured as a beam with a bendable material layer and a piezoelectric material layer the cause the beam to bend. The bending force can be increased by coupling a magnet to the beam and positioning a ferritic plate near the magnet. Alternatively, a ferritic plate can be attached to the beam, with the magnet positioned apart from, but near, the plate. The haptic actuator can have a two-sided piezoelectric configuration, having a piezoelectric layer on each side of the bendable material layer. A two-sided piezoelectric configuration can have a second magnet and ferritic plate pair on a side of the beam opposite the first. The haptic actuator may use electromagnets.

20 Claims, 14 Drawing Sheets

(56) References Cited

U.S. PATENT DOCUMENTS

| | | |
|---|---|---|
| 5,842,967 A | 1/1998 | Kroll |
| 5,739,759 A | 4/1998 | Nakazawa et al. |
| 6,084,319 A | 7/2000 | Kamata et al. |
| 6,342,880 B2 | 1/2002 | Rosenberg et al. |
| 6,373,465 B2 | 4/2002 | Jolly et al. |
| 6,388,789 B1 | 5/2002 | Bernstein |
| 6,438,393 B1 | 8/2002 | Surronen |
| 6,445,093 B1 | 9/2002 | Binnard |
| 6,493,612 B1 | 12/2002 | Bisset et al. |
| 6,554,191 B2 | 4/2003 | Yoneya |
| 6,693,622 B1 | 2/2004 | Shahoian et al. |
| 6,777,895 B2 | 8/2004 | Shimoda et al. |
| 6,822,635 B2 | 11/2004 | Shahoian |
| 6,864,877 B2 | 3/2005 | Braun et al. |
| 6,952,203 B2 | 10/2005 | Banerjee et al. |
| 6,988,414 B2 | 1/2006 | Ruhrig et al. |
| 7,068,168 B2 | 6/2006 | Girshovich et al. |
| 7,080,271 B2 | 7/2006 | Kardach et al. |
| 7,130,664 B1 | 10/2006 | Williams |
| 7,196,688 B2 | 3/2007 | Shena et al. |
| 7,202,851 B2 | 4/2007 | Cunningham et al. |
| 7,234,379 B2 | 6/2007 | Claesson et al. |
| 7,253,350 B2 | 8/2007 | Noro et al. |
| 7,276,907 B2 | 10/2007 | Kitagawa et al. |
| 7,321,180 B2 | 1/2008 | Takeuchi et al. |
| 7,323,959 B2 | 1/2008 | Naka et al. |
| 7,336,006 B2 | 2/2008 | Watanabe et al. |
| 7,339,572 B2 | 3/2008 | Schena |
| 7,355,305 B2 | 4/2008 | Nakamura et al. |
| 7,360,446 B2 | 4/2008 | Dai et al. |
| 7,370,289 B1 | 5/2008 | Ebert et al. |
| 7,392,066 B2 | 6/2008 | Hapamas |
| 7,423,631 B2 | 9/2008 | Shahoian et al. |
| 7,508,382 B2 | 3/2009 | Denoue et al. |
| 7,570,254 B2 | 8/2009 | Suzuki et al. |
| 7,576,477 B2 | 8/2009 | Koizumi |
| 7,656,388 B2 | 2/2010 | Schena et al. |
| 7,667,371 B2 | 2/2010 | Sadler et al. |
| 7,667,691 B2 | 2/2010 | Boss et al. |
| 7,675,414 B2 | 3/2010 | Ray |
| 7,710,397 B2 | 5/2010 | Krah et al. |
| 7,710,399 B2 | 5/2010 | Bruneau et al. |
| 7,741,938 B2 | 6/2010 | Kramlich |
| 7,755,605 B2 | 7/2010 | Daniel et al. |
| 7,798,982 B2 | 9/2010 | Zets et al. |
| 7,825,903 B2 | 11/2010 | Anastas et al. |
| 7,855,657 B2 | 12/2010 | Doemens et al. |
| 7,890,863 B2 | 2/2011 | Grant et al. |
| 7,893,922 B2 | 2/2011 | Klinghult et al. |
| 7,904,210 B2 | 3/2011 | Pfau et al. |
| 7,911,328 B2 | 3/2011 | Luden et al. |
| 7,919,945 B2 | 4/2011 | Houston et al. |
| 7,952,261 B2 | 5/2011 | Lipton et al. |
| 7,952,566 B2 | 5/2011 | Poupyrev et al. |
| 7,956,770 B2 | 6/2011 | Klinghult et al. |
| 7,976,230 B2 | 7/2011 | Ryynanen et al. |
| 8,002,089 B2 | 8/2011 | Jasso et al. |
| 8,020,266 B2 | 9/2011 | Ulm et al. |
| 8,040,224 B2 | 10/2011 | Hwang |
| 8,053,688 B2 | 11/2011 | Conzola et al. |
| 8,063,892 B2 | 11/2011 | Shahoian |
| 8,081,156 B2 | 12/2011 | Ruettiger |
| 8,125,453 B2 | 2/2012 | Shahoian et al. |
| 8,154,537 B2 | 4/2012 | Olien et al. |
| 8,174,495 B2 | 5/2012 | Takashima et al. |
| 8,174,512 B2 | 5/2012 | Ramstein et al. |
| 8,169,402 B2 | 6/2012 | Shahoian et al. |
| 8,217,892 B2 | 7/2012 | Meadors |
| 8,217,910 B2 | 7/2012 | Stallings et al. |
| 8,232,494 B2 | 7/2012 | Purcocks |
| 8,248,386 B2 | 8/2012 | Harrison |
| 8,253,686 B2 | 8/2012 | Kyung |
| 8,262,480 B2 | 9/2012 | Cohen et al. |
| 8,264,465 B2 | 9/2012 | Grant et al. |
| 8,265,292 B2 | 9/2012 | Leichter |
| 8,265,308 B2 | 9/2012 | Gitzinger et al. |
| 8,344,834 B2 | 1/2013 | Niiyama |
| 8,345,025 B2 | 1/2013 | Seibert et al. |
| 8,351,104 B2 | 1/2013 | Zaifrani et al. |
| 8,378,797 B2 | 2/2013 | Pance et al. |
| 8,378,965 B2 | 2/2013 | Gregorio et al. |
| 8,384,316 B2 | 2/2013 | Houston et al. |
| 8,390,218 B2 | 3/2013 | Houston et al. |
| 8,390,572 B2 | 3/2013 | Marsden et al. |
| 8,390,594 B2 | 3/2013 | Modarres et al. |
| 8,400,027 B2 | 3/2013 | Dong et al. |
| 8,405,618 B2 | 3/2013 | Colgate et al. |
| 8,421,609 B2 | 4/2013 | Kim et al. |
| 8,432,365 B2 | 4/2013 | Kim et al. |
| 8,469,806 B2 | 6/2013 | Grant et al. |
| 8,471,690 B2 | 6/2013 | Hennig et al. |
| 8,493,177 B2 | 7/2013 | Flaherty et al. |
| 8,493,189 B2 | 7/2013 | Suzuki |
| 8,576,171 B2 | 11/2013 | Grant |
| 8,598,750 B2 | 12/2013 | Park |
| 8,598,972 B2 | 12/2013 | Cho et al. |
| 8,605,141 B2 | 12/2013 | Dialameh et al. |
| 8,614,431 B2 | 12/2013 | Huppi et al. |
| 8,619,031 B2 | 12/2013 | Hayward |
| 8,624,448 B2 | 1/2014 | Kaiser et al. |
| 8,628,173 B2 | 1/2014 | Stephens et al. |
| 8,633,916 B2 | 1/2014 | Bernstein et al. |
| 8,639,485 B2 | 1/2014 | Connacher et al. |
| 8,648,829 B2 | 2/2014 | Shahoian et al. |
| 8,653,785 B2 | 2/2014 | Collopy |
| 8,654,524 B2 | 2/2014 | Pance et al. |
| 8,681,130 B2 | 3/2014 | Adhikari |
| 8,686,952 B2 | 4/2014 | Burrough |
| 8,717,151 B2 | 5/2014 | Forutanpour et al. |
| 8,730,182 B2 | 5/2014 | Modarres et al. |
| 8,749,495 B2 | 6/2014 | Grant et al. |
| 8,754,759 B2 | 6/2014 | Fadell et al. |
| 8,760,037 B2 | 6/2014 | Eshed et al. |
| 8,773,247 B2 | 7/2014 | Ullrich |
| 8,780,074 B2 | 7/2014 | Castillo et al. |
| 8,797,153 B2 | 8/2014 | Vanhelle et al. |
| 8,797,295 B2 | 8/2014 | Bernstein |
| 8,803,670 B2 | 8/2014 | Steckel et al. |
| 8,834,390 B2 | 9/2014 | Couvillon |
| 8,836,502 B2 | 9/2014 | Culbert et al. |
| 8,836,643 B2 | 9/2014 | Romera Joliff et al. |
| 8,867,757 B1 | 10/2014 | Ooi |
| 8,872,448 B2 | 10/2014 | Boldyrev et al. |
| 8,878,401 B2 | 11/2014 | Lee |
| 8,890,824 B2 | 11/2014 | Guard |
| 8,907,661 B2 | 12/2014 | Maier et al. |
| 8,976,139 B2 | 3/2015 | Koga et al. |
| 8,976,141 B2 | 3/2015 | Myers et al. |
| 8,977,376 B1 | 3/2015 | Lin et al. |
| 8,981,682 B2 | 3/2015 | Delson et al. |
| 8,987,951 B2 | 3/2015 | Park |
| 9,008,730 B2 | 4/2015 | Kim et al. |
| 9,024,738 B2 | 5/2015 | Van Schyndel et al. |
| 9,046,947 B2 | 6/2015 | Takeda |
| 9,049,339 B2 | 6/2015 | Muench |
| 9,052,785 B2 | 6/2015 | Horie |
| 9,054,605 B2 | 6/2015 | Jung et al. |
| 9,058,077 B2 | 6/2015 | Lazaridis et al. |
| 9,086,727 B2 | 7/2015 | Tidemand et al. |
| 9,092,056 B2 | 7/2015 | Myers et al. |
| 9,104,285 B2 | 8/2015 | Colgate et al. |
| 9,116,570 B2 | 8/2015 | Lee et al. |
| 9,122,330 B2 | 9/2015 | Bau et al. |
| 9,134,796 B2 | 9/2015 | Lemmons et al. |
| 9,172,669 B2 | 10/2015 | Swink et al. |
| 9,182,837 B2 | 11/2015 | Day |
| 9,218,727 B2 | 12/2015 | Rothkopf et al. |
| 9,256,287 B2 | 2/2016 | Shinozaki et al. |
| 9,274,601 B2 | 3/2016 | Faubert et al. |
| 9,280,205 B2 | 3/2016 | Rosenberg et al. |
| 9,286,907 B2 | 3/2016 | Yang et al. |
| 9,304,587 B2 | 4/2016 | Wright et al. |
| 9,319,150 B2 | 4/2016 | Peeler et al. |
| 9,361,018 B2 | 6/2016 | Pasquero et al. |

(56) References Cited

U.S. PATENT DOCUMENTS

| | | |
|---|---|---|
| 9,396,629 B1 | 7/2016 | Weber et al. |
| 9,430,042 B2 | 8/2016 | Levin |
| 9,436,280 B2 | 9/2016 | Tartz et al. |
| 9,442,570 B2 | 9/2016 | Slonneger |
| 9,448,713 B2 | 9/2016 | Cruz-Hernandez et al. |
| 9,449,476 B2 | 9/2016 | Lynn et al. |
| 9,459,734 B2 | 10/2016 | Day |
| 9,466,783 B2 | 10/2016 | Olien et al. |
| 9,489,049 B2 | 11/2016 | Li |
| 9,496,777 B2 | 11/2016 | Jung |
| 9,501,149 B2 | 11/2016 | Burnbaum et al. |
| 9,513,704 B2 | 12/2016 | Heubel et al. |
| 9,519,346 B2 | 12/2016 | Lacroix |
| 9,535,500 B2 | 1/2017 | Pasquero et al. |
| 9,539,164 B2 | 1/2017 | Sanders et al. |
| 9,557,830 B2 | 1/2017 | Grant |
| 9,557,857 B2 | 1/2017 | Schediwy |
| 9,563,274 B2 | 2/2017 | Senanayake |
| 9,564,029 B2 | 2/2017 | Morrell et al. |
| 9,594,429 B2 | 3/2017 | Bard et al. |
| 9,600,037 B2 | 3/2017 | Pance et al. |
| 9,600,071 B2 | 3/2017 | Rothkopf |
| 9,607,491 B1 * | 3/2017 | Mortimer .................. G08B 6/00 |
| 9,632,583 B2 | 4/2017 | Virtanen et al. |
| 9,639,158 B2 | 5/2017 | Levesque |
| 9,666,040 B2 | 5/2017 | Flaherty et al. |
| 9,707,593 B2 | 7/2017 | Berte |
| 9,710,061 B2 | 7/2017 | Pance et al. |
| 9,727,238 B2 | 8/2017 | Peh et al. |
| 9,733,704 B2 | 8/2017 | Cruz-Hernandez et al. |
| 9,762,236 B2 | 9/2017 | Chen |
| 9,829,981 B1 | 11/2017 | Ji |
| 9,857,872 B2 | 1/2018 | Terlizzi et al. |
| 9,870,053 B2 | 1/2018 | Modarres |
| 9,875,625 B2 | 1/2018 | Khoshkava et al. |
| 9,886,090 B2 | 2/2018 | Silvanto et al. |
| 9,902,186 B2 | 2/2018 | Whiteman et al. |
| 9,904,393 B2 | 2/2018 | Frey et al. |
| 9,921,649 B2 | 3/2018 | Grant et al. |
| 9,927,887 B2 | 3/2018 | Bulea |
| 9,927,902 B2 | 3/2018 | Burr et al. |
| 9,928,950 B2 | 3/2018 | Lubinski et al. |
| 9,940,013 B2 | 4/2018 | Choi et al. |
| 9,977,499 B2 | 5/2018 | Westerman et al. |
| 9,996,199 B2 | 6/2018 | Park |
| 10,025,399 B2 | 7/2018 | Kim et al. |
| 10,037,660 B2 | 7/2018 | Khoshkava et al. |
| 10,061,385 B2 | 8/2018 | Churikov |
| 10,082,873 B2 | 9/2018 | Zhang |
| 10,110,986 B1 | 10/2018 | Min |
| 10,120,478 B2 | 11/2018 | Filiz et al. |
| 10,122,184 B2 | 11/2018 | Smadi |
| 10,139,976 B2 | 11/2018 | Iuchi et al. |
| 10,152,131 B2 | 12/2018 | Grant |
| 10,235,849 B1 | 3/2019 | Levesque |
| 10,275,075 B2 | 4/2019 | Hwang et al. |
| 10,289,199 B2 | 5/2019 | Hoellwarth |
| 10,346,117 B2 | 7/2019 | Sylvan et al. |
| 10,372,214 B1 | 8/2019 | Gleeson et al. |
| 10,382,866 B2 | 8/2019 | Min |
| 10,390,139 B2 | 8/2019 | Biggs |
| 10,394,326 B2 | 8/2019 | Ono |
| 10,397,686 B2 | 8/2019 | Forstner |
| 10,430,077 B2 | 10/2019 | Lee |
| 10,437,359 B1 | 10/2019 | Wang et al. |
| 10,556,252 B2 | 2/2020 | Tsang et al. |
| 2003/0117132 A1 | 6/2003 | Klinghult |
| 2005/0036603 A1 | 2/2005 | Hughes |
| 2005/0057120 A1 | 3/2005 | Nanataki et al. |
| 2005/0191604 A1 | 9/2005 | Allen |
| 2005/0230594 A1 | 10/2005 | Sato et al. |
| 2006/0017691 A1 | 1/2006 | Cruz-Hernandez et al. |
| 2006/0209037 A1 | 9/2006 | Wang et al. |
| 2006/0223547 A1 | 10/2006 | Chin et al. |
| 2006/0252463 A1 | 11/2006 | Liao |
| 2007/0106457 A1 | 5/2007 | Rosenberg |
| 2007/0152974 A1 | 7/2007 | Kim et al. |
| 2008/0062145 A1 | 3/2008 | Shahoian |
| 2008/0062624 A1 | 3/2008 | Regen |
| 2008/0084384 A1 | 4/2008 | Gregorio et al. |
| 2008/0111791 A1 | 5/2008 | Nikittin |
| 2009/0085879 A1 | 4/2009 | Dai et al. |
| 2009/0115734 A1 | 5/2009 | Fredriksson et al. |
| 2009/0166098 A1 | 7/2009 | Sunder |
| 2009/0167702 A1 | 7/2009 | Nurmi |
| 2009/0174672 A1 | 7/2009 | Schmidt |
| 2009/0207129 A1 | 8/2009 | Ullrich et al. |
| 2009/0225046 A1 | 9/2009 | Kim et al. |
| 2009/0243404 A1 | 10/2009 | Kim et al. |
| 2009/0267892 A1 | 10/2009 | Faubert |
| 2010/0116629 A1 | 5/2010 | Borissov et al. |
| 2010/0225600 A1 | 9/2010 | Dai et al. |
| 2010/0231508 A1 | 9/2010 | Cruz-Hernandez et al. |
| 2010/0313425 A1 | 12/2010 | Hawes |
| 2010/0328229 A1 | 12/2010 | Weber et al. |
| 2011/0115754 A1 | 5/2011 | Cruz-Hernandez |
| 2011/0128239 A1 | 6/2011 | Polyakov et al. |
| 2011/0132114 A1 | 6/2011 | Siotis |
| 2011/0169347 A1 | 7/2011 | Miyamoto et al. |
| 2011/0181150 A1 | 7/2011 | Mahameed et al. |
| 2011/0205038 A1 | 8/2011 | Drouin et al. |
| 2011/0261021 A1 | 10/2011 | Modarres et al. |
| 2012/0038469 A1 | 2/2012 | Dehmoubed et al. |
| 2012/0038471 A1 | 2/2012 | Kim et al. |
| 2012/0056825 A1 | 3/2012 | Ramsay et al. |
| 2012/0062491 A1 | 3/2012 | Coni et al. |
| 2012/0113008 A1 | 5/2012 | Makinen et al. |
| 2012/0127071 A1 | 5/2012 | Jitkoff et al. |
| 2012/0127088 A1 | 5/2012 | Pance et al. |
| 2012/0235942 A1 | 9/2012 | Shahoian |
| 2012/0327006 A1 | 12/2012 | Israr et al. |
| 2013/0016042 A1 | 1/2013 | Makinen et al. |
| 2013/0043670 A1 | 2/2013 | Holmes |
| 2013/0044049 A1 | 2/2013 | Biggs et al. |
| 2013/0076635 A1 | 3/2013 | Lin |
| 2013/0154996 A1 | 6/2013 | Trend et al. |
| 2013/0207793 A1 | 8/2013 | Weaber et al. |
| 2014/0062948 A1 | 3/2014 | Lee et al. |
| 2014/0125470 A1 | 5/2014 | Rosenberg |
| 2014/0168175 A1 | 6/2014 | Mercea et al. |
| 2014/0265727 A1 * | 9/2014 | Berte .................... B06B 1/0603<br>310/317 |
| 2015/0084909 A1 | 3/2015 | Worfolk et al. |
| 2015/0097635 A1 | 4/2015 | Maharjan et al. |
| 2015/0126070 A1 | 5/2015 | Candelore |
| 2015/0130730 A1 | 5/2015 | Harley et al. |
| 2015/0234493 A1 | 8/2015 | Parivar et al. |
| 2015/0293592 A1 | 10/2015 | Cheong et al. |
| 2015/0338919 A1 | 11/2015 | Weber et al. |
| 2015/0349619 A1 | 12/2015 | Degner et al. |
| 2016/0098107 A1 | 4/2016 | Morrell et al. |
| 2016/0171767 A1 | 6/2016 | Anderson et al. |
| 2016/0209979 A1 | 7/2016 | Endo et al. |
| 2016/0293829 A1 | 10/2016 | Maharjan et al. |
| 2016/0327911 A1 | 11/2016 | Eim et al. |
| 2016/0328930 A1 | 11/2016 | Weber et al. |
| 2016/0379776 A1 | 12/2016 | Oakley |
| 2017/0003744 A1 | 1/2017 | Bard et al. |
| 2017/0024010 A1 | 1/2017 | Weinraub |
| 2017/0111734 A1 | 4/2017 | Macours |
| 2017/0249024 A1 | 8/2017 | Jackson et al. |
| 2017/0285843 A1 | 10/2017 | Roberts-Hoffman et al. |
| 2017/0337025 A1 | 11/2017 | Finnan et al. |
| 2017/0357325 A1 | 12/2017 | Yang et al. |
| 2018/0005496 A1 | 1/2018 | Dogiamis |
| 2018/0014096 A1 | 1/2018 | Miyoshi |
| 2018/0029078 A1 | 2/2018 | Park et al. |
| 2018/0081438 A1 | 3/2018 | Lehmann |
| 2018/0181204 A1 | 6/2018 | Weinraub |
| 2018/0194229 A1 | 7/2018 | Wachinger |
| 2018/0321841 A1 | 11/2018 | Lapp |
| 2019/0064997 A1 | 2/2019 | Wang et al. |

(56) References Cited

U.S. PATENT DOCUMENTS

| | | |
|---|---|---|
| 2019/0073079 A1 | 3/2019 | Xu et al. |
| 2019/0310724 A1 | 10/2019 | Yazdandoost |
| 2020/0004337 A1 | 1/2020 | Hendren et al. |

FOREIGN PATENT DOCUMENTS

| | | |
|---|---|---|
| CN | 101409164 | 4/2009 |
| CN | 101436099 | 5/2009 |
| CN | 101663104 | 3/2010 |
| CN | 101872257 | 10/2010 |
| CN | 201897778 | 7/2011 |
| CN | 201945951 | 8/2011 |
| CN | 102349039 | 2/2012 |
| CN | 203405773 | 1/2014 |
| CN | 203630729 | 6/2014 |
| CN | 104679233 | 6/2015 |
| CN | 105144052 | 12/2015 |
| CN | 106133650 | 11/2016 |
| CN | 206339935 | 7/2017 |
| CN | 207115337 | 3/2018 |
| DE | 214030 | 3/1983 |
| EP | 1686776 | 8/2006 |
| EP | 2743798 | 6/2014 |
| JP | 2004129120 | 4/2004 |
| JP | 2004236202 | 8/2004 |
| JP | 2010537279 | 12/2010 |
| JP | 2010540320 | 12/2010 |
| KR | 20050033909 | 4/2005 |
| KR | 101016208 | 2/2011 |
| KR | 101016208 B1 * | 2/2011 |
| KR | 20130137124 | 12/2013 |
| TV | 2010035805 | 10/2010 |
| TW | 201430623 | 8/2014 |
| WO | WO2002/073587 | 9/2002 |
| WO | WO2006/091494 | 8/2006 |
| WO | WO2007/049253 | 5/2007 |
| WO | WO2007/114631 | 10/2007 |
| WO | WO2009/038862 | 3/2009 |
| WO | WO 09/156145 | 12/2009 |
| WO | WO2010/129892 | 11/2010 |
| WO | WO2013/169303 | 11/2013 |
| WO | WO2014/066516 | 5/2014 |
| WO | WO2016/091944 | 6/2016 |

OTHER PUBLICATIONS

Hasser et al., "Preliminary Evaluation of a Shape-Memory Alloy Tactile Feedback Display," Advances in Robotics, Mechantronics, and Haptic Interfaces, ASME, DSC—vol. 49, pp. 73-80, 1993.

Hill et al., "Real-time Estimation of Human Impedance for Haptic Interfaces," Stanford Telerobotics Laboratory, Department of Mechanical Engineering, Standford University, 6 pages, at least as early as Sep. 30, 2009.

Lee et al, "Haptic Pen: Tactile Feedback Stylus for Touch Screens," Mitsubishi Electric Research Laboratories, http://wwwlmerl.com, 6 pages, Oct. 2004.

Stein et al., "A process chain for integrating piezoelectric transducers into aluminum die castings to generate smart lightweight structures," Results in Physics 7, pp. 2534-2539, 2017.

U.S. Appl. No. 15/350,592, filed Nov. 14, 2016, pending.
U.S. Appl. No. 15/357,956, filed Nov. 21, 2016, pending.
U.S. Appl. No. 15/366,674, filed Dec. 1, 2016, pending.
U.S. Appl. No. 15/445,383, filed Feb. 28, 2017, pending.
U.S. Appl. No. 15/846,809, filed Dec. 19, 2017, pending.
U.S. Appl. No. 15/900,728, filed Feb. 20, 2018, pending.
U.S. Appl. No. 16/102,557, filed Aug. 13, 2018, pending.

"Lofelt at Smart Haptics 2017," Auto-generated transcript from YouTube video clip, uploaded on Jun. 12, 2018 by user "Lofelt," Retrieved from Internet: <https://www.youtube.com/watch?v=3w7LTQkS430>, 3 pages.

"Tutorial: Haptic Feedback Using Music and Audio-Precision Microdrives," Retrieved from Internet Nov. 13, 2019: https://www.precisionmicrodrives.com/haptic-feedback/tutorial-haptic-feedback-using-music-and-audio/, 9 pages.

"Feel what you hear: haptic feedback as an accompaniment to mobile music playback," Retrieved from Internet Nov. 13, 2019: https://dl.acm.org/citation.cfm?id=2019336, 2 pages.

"Auto Haptic Widget for Android," Retrieved from Internet Nov. 13, 2019, https://apkpure.com/auto-haptic-widget/com.immersion.android.autohaptic, 3 pages.

D-Box Home, Retrieved from Internet Nov. 12, 2019: https://web.archive.org/web/20180922193345/https://www.d-box.com/en, 4 pages.

* cited by examiner

ELECTRONIC DEVICE HAVING A HAPTIC ACTUATOR WITH MAGNETIC AUGMENTATION

FIELD

This disclosure generally relates to an electronic device having a haptic actuator; and more specifically, an electronic device having a haptic actuator with a piezoelectric cantilever configured to produce a tactile output along a surface of the device.

BACKGROUND

Electronic devices include a variety of ways to provide feedback or output to a user. For example, many traditional electronic devices include a display that can be used to produce a visual output or feedback to the user. Many electronic devices may also include a speaker or other audio component for providing an acoustic output or feedback to a user. The embodiments described herein are directed to an electronic device having a haptic actuator for producing another type of output. In particular, the embodiments described herein are directed to a haptic actuator that is configured to produce a tactile output or feedback along an exterior surface of the device. The haptic actuators described herein may be particularly well suited for integration into portable electronic devices where space is limited.

SUMMARY

This summary is provided to introduce a selection of concepts in a simplified form that are further described below in the Detailed Description section. This summary is not intended to identify key features or essential features of the claimed subject matter, nor is it intended to be used as an aid in determining the scope of the claimed subject matter.

Disclosed herein are electronic devices that have haptic actuators that create haptic or tactile outputs on an exterior surface of the electronic device. The haptic actuators use various configurations of piezoelectric structures configured to bend or move in response to actuation signals.

More specifically, described herein is an electronic device having an enclosure defining an exterior surface and an interior volume, in which is a haptic actuator. The haptic actuator comprises an elongated substrate with a first end fixed with respect to the enclosure, and a second end free to move in an actuation direction transverse to a length of the elongated substrate. The elongated substrate has attached along one side a piezoelectric layer. A magnetic element is coupled to the elongated substrate towards its second end. A ferritic plate is positioned near, but separate from, the magnetic element to form a gap. The haptic actuator also includes control circuitry that applies an actuation signal to the piezoelectric layer which causes a movement of the elongated substrate, which then causes a localized deflection of the enclosure along the exterior surface. Additionally, the haptic actuator may have an actuator tab positioned toward the second end of the elongated substrate.

Additional and/or other embodiments have two piezoelectric layers positioned on opposite sides of the elongated substrate, two magnetic elements on opposite sides of the elongated substrate, and two ferritic plates on opposite sides of the elongated substrate. For such embodiments there may be a single stable state in which magnetic attraction forces balance the elongated substrate between the two ferritic plates. Alternatively, there may be two stable states, in which the elongated substrate is bent toward the first or the second ferritic plate.

Also described herein is an electronic device having an enclosure defining an exterior surface and an interior volume that includes a haptic actuator. The haptic actuator comprises an elongated substrate with a first end fixed with respect to the enclosure, and a second end free to move in an actuation direction transverse to a length of the elongated substrate. The elongated substrate has a piezoelectric layer attached along one side. A ferritic plate is coupled to the elongated substrate towards its second end. A magnet structure is positioned near, but separate from, the ferritic plate to form a gap. A control unit is configured to apply an actuation signal to the piezoelectric layer, which causes the elongated substrate to move along the actuation direction, which causes a tactile output at the exterior surface of the electronic device. Additionally, the haptic actuator may have an extension positioned toward the second end of the elongated substrate. The magnet structure may be implemented as a Halbach array, or as an electromagnet. When an electromagnet is used, the control unit may also be able to apply a de-actuation signal to the piezoelectric layer to cause the elongated substrate to bend so that the magnet structure and the ferritic plate move apart.

Additional and/or alternative embodiments have two piezoelectric layers positioned along opposite sides of the elongated substrate, two ferritic plates coupled to the elongated substrate on opposite sides, and two magnet structures placed near but separate from the ferritic plates. For such embodiments there may be a single stable state in which magnetic attraction forces balance the elongated substrate between the two magnet structures. Alternatively, there may be two stable states, in which the elongated substrate is bent toward the first or the second magnet structure.

Also described herein is an electronic device having an enclosure defining an exterior surface, an interior surface, and an interior volume that includes a haptic actuator. The haptic actuator comprises an elongated substrate with a first end fixed with respect to the enclosure, and a second end free to move in an actuation direction transverse to a length of the elongated substrate. The elongated substrate has two piezoelectric layers attached along opposite sides. A first magnet structure is coupled to the elongated substrate towards its second end. A second magnet structure is positioned near, but separate from, the first magnet structure to form a gap. A control unit is configured to apply an actuation signal to the piezoelectric layers, which cause the elongated substrate to move along the actuation direction, which causes a tactile output at the exterior surface of the electronic device. In additional and/or alternative embodiments, the second magnet structure is an electromagnet, with current controlled by the control unit, and magnetic poles of the first and the second magnet structures oriented toward each other.

In additional and/or alternative embodiments, a third magnet structure is coupled to the elongated substrate toward the second end, and a fourth magnet structure positioned near but separate from the third magnet structure to form a corresponding gap. The fourth magnet structure can be an electromagnet, and the control unit can apply a de-actuation signal to at least one of the electromagnets to cause a repulsion force.

BRIEF DESCRIPTION OF THE DRAWINGS

The disclosure will be readily understood by the following detailed description in conjunction with the accompanying drawings, wherein like reference numerals designate like structural elements.

Figure 1A:
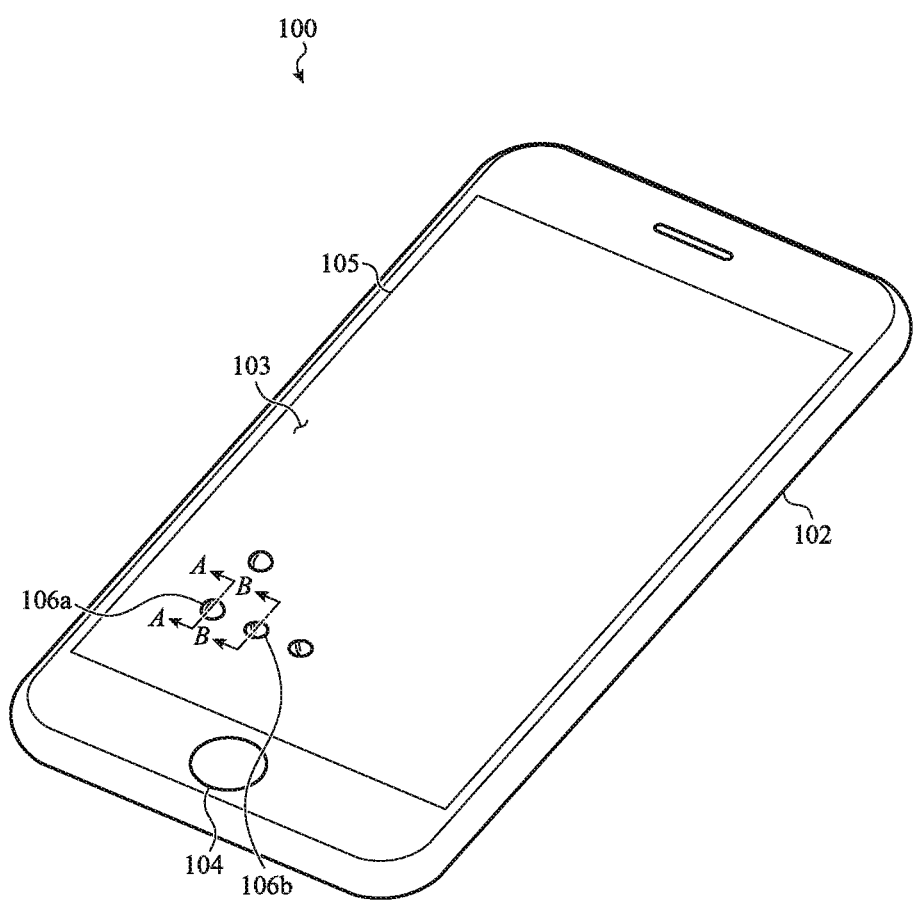
FIG. 1A illustrates a front of an electronic device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The embodiments described herein are directed to electronic devices having haptic actuators that use flexible piezoelectric structures to produce haptic or tactile outputs. The piezoelectric structures have one or more components or layers of piezoelectric material connected to a substrate or layer of bendable material. The piezoelectric materials may be actuated by, for example, applying a voltage or electrical signal, which causes the piezoelectric materials to expand or contract which, in turn, causes the flexible substrate to bend or flex. Bending or flexing of the flexible substrate may produce the haptic or tactile output.

Some example embodiments are directed to a cantilevered piezoelectric structure. For example, the piezoelectric structure may be configured as an elongated substrate (e.g., a beam or shaft) that is fixed at one end and extends towards a free end to define a cantilever structure. In response to actuation of a piezoelectric material coupled to the elongated substrate, the free end can move or oscillate along an actuation direction that is transverse to the length or long axis of the elongated substrate. The movement of the free end of the beam or shaft may follow an arced or nonlinear path. As used herein, "actuation direction" will refer to either of the two directions transverse to the long axis of the beam. The free end can be connected, either directly or indirectly, to a component of the electronic device on which the user can tactilely feel a touch, movement, or vibration. For example, the user may tactilely feel a local deformation of an exterior surface or the oscillations or vibrations of the haptic structure.

In some embodiments, an actuator tab or extension is connected to the free end and oriented in the actuation direction of the vibration or motion of the free end. The actuator tab or extension can contact an inner surface of a housing or enclosure of the electronic device so that movement of the haptic actuator causes a haptic or tactile output on an exterior surface of the housing.

The term "haptic actuator", as used herein, may be used to refer to an actuator or device that can be used to produce a haptic or tactile output. A haptic output, depending on the implementation, may be generally used to refer to an output that may be sensed kinesthetically or tactilely by the user. As the name implies, a tactile output may be used to refer to an output that is sensed tactilely or through a touch of the user.

The haptic actuators described herein may include one or two piezoelectric elements and may be referred to as one-sided (also termed "unimorph") or two-sided (also termed "bimorph") piezoelectric structures, respectively. These terms and the corresponding description are provided by way of example and various implementations may use more than two piezoelectric elements and/or rearrange the various elements to achieve the same results and effects described herein. For purposes of this disclosure, the term one-sided piezoelectric structure may be used to refer to a structure in which the beam or elongated substrate contains a layer of piezoelectric material affixed to one side of the substrate. An applied voltage may cause the piezoelectric material to contract or expand, and so cause the substrate layer to bend or deflect. As used herein, the term two-sided piezoelectric structure may be used to refer to a structure in which a second layer of piezoelectric material is attached to the beam or elongated substrate along a side opposite to the first layer of piezoelectric material. If the first piezoelectric layer is made to contract, and the second piezoelectric layer is made to expand, an even larger bending force may be applied to the bendable substrate layer, enhancing the haptic output response.

For some implementations, it may be desirable to increase the movement to produce an increased haptic or tactile output. The bendable material of the elongated substrate typically exerts a restoring force that counteracts the bending force applied by the piezoelectric layers. Such a restoring force typically increases with the amount of bending or deflection, which may limit the effective stroke or movement that can be provided by a particular piezoelectric structure. To increase the movement or stroke of a haptic actuator, various embodiments described herein provide an augmenting force using the attraction between a magnet and a plate of ferritic material, or between a magnet and another magnet. When a pole of a magnet is directed to a ferritic plate or object, as the magnet approaches the ferritic material, the force on each increases. Embodiments disclosed below use various configurations of magnets and ferritic plates to augment the bending force applied by the piezoelectric material. In one embodiment, the haptic actuator has a cantilever configuration for a one-sided piezoelectric structure for the piezoelectric material and the bendable substrate. A magnet is affixed towards the free end of the actuator on one side, with one of its poles directed transverse to the long axis of the haptic actuator and toward a ferritic plate mounted apart or separate from the haptic actuator to leave a gap between the plate and the magnet. As the haptic actuator is bent by actuation of the piezoelectric layer, the force between the plate and magnet increases and so augments the bending or deflection of the haptic actuator.

As described herein, a more balanced configuration may be obtained using a two-sided piezoelectric structure, with a second magnet attached to the haptic actuator opposite the first magnet, and a second ferritic plate mounted near the second magnet but apart from the haptic actuator. A second force between the second magnet and the second plate is applied to the haptic actuator in a direction opposite to the first force between the first plate and the first magnet. These two augmentation forces can balance in the absence of actuation applied to the piezoelectric layers, producing to a single stable equilibrium position for the haptic actuator.

Other embodiments use alternative configurations and positions for the ferritic plates and magnets. For example, one or more ferritic plates may be positioned on the elongated haptic actuator structure, with the magnets mounted separate from the haptic actuator so as to leave a gap with their respective plates. The individual magnets themselves may be implemented as electromagnets, may be a Halbach array, or may have another implementation.

Further, although certain electronic devices are specifically mentioned as examples, the haptic actuators are not limited to those examples.

These and other embodiments are discussed below with reference to FIGS. 1A-10. However, those skilled in the art will readily appreciate that the detailed description given herein with respect to these Figures is for explanatory purposes only and should not be construed as limiting.

FIG. 1A shows an electronic device 100 that may use various embodiments of the haptic actuators discussed below. The electronic device 100 in FIG. 1A may be a smart phone, a tablet computer, a personal electronic device, a wearable electronic device, or any other type of electronic device. The electronic device 100 shown includes an enclosure 102 defining an interior volume of the electronic device 100. The enclosure 102 includes a housing and cover sheet (e.g., cover glass) that define an exterior surface 103. The exterior surface (hereinafter "surface") may include any exterior surface of the device 100 including a display, housing, cover, case, or other component forming a portion of an exterior of the device 100.

As shown in FIG. 1A, the device 100 may include a display 105 that is configured to produce a graphical or visual output for the device 100. The display 105 may include or be positioned below a cover sheet, such as a cover glass or cover made from another transparent material. The display 105 may include a liquid-crystal display (LCD) element, an organic light-emitting diode (OLED) element, an electroluminescent (EL) element, or other type of display element that can be configured to produce a graphical or visual output for the device 100.

In some implementations, the display 105 is a touch-sensitive display that includes a touch sensor configured to receive touch input. The touch sensor may include an array of capacitive nodes that are configured to detect the presence and location of a user's finger. The electronic device 100 may also have one or more dedicated mechanisms, such as a push button 104, by which a user can provide a button-press input. The device 100 may be responsive to the touch input or button-press input and may be configured to perform a function or produce a corresponding output in response to the touch input. For example, the device 100 may include one or more haptic actuators, as described herein, that are configured or that are operable to produce a tactile output in response to a touch input detected using the touch-sensitive display.

In the example of FIG. 1A, one or more haptic actuators may be configured to produce a tactile output along the exterior surface 103 of the device 100 (e.g., the surface of the cover sheet or cover glass). As shown in FIG. 1A, the external surface 103 of the enclosure 102 may locally deform or deflect to create a protrusion 106a or a recess 106b. The protrusion 106a may form a protrusion that is sufficiently raised to be tactically perceptible to the user. Similarly, the recess 106b may be sufficiently recessed to be tactically perceptible to the user. In some cases, the degree of deflection may range between 0.1 mm to 1 mm or greater. The tactile output due to the protrusion 106a or the recess 106b may depend on the amount of deflection, as well as the speed and/or location of the deflection. In some cases, multiple local deflections are used in combination to produce a particular tactile output.

Figure 1B:
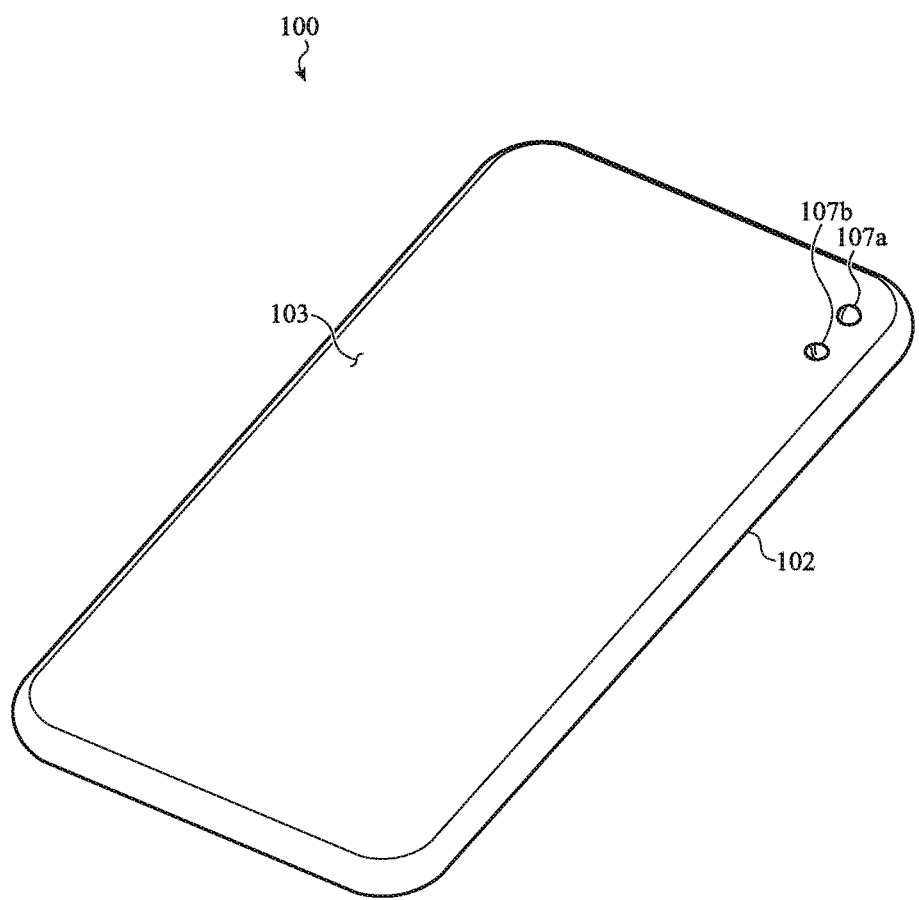
FIG. 1B illustrates a back of an electronic device.

FIG. 1B depicts a rear view of a device having a haptic actuator, in accordance with the embodiments described herein. More specifically, FIG. 1B depicts an electronic device 100 that includes a haptic actuator configured to produce a tactile output along a rear portion of the exterior surface 103 of the enclosure 102. In this example, one or more haptic actuators may be configured or operable to produce a local deformation that is tactically perceptible to a user. As shown in FIG. 1B, the rear portion of the exterior surface 103 of the enclosure 102 may locally deform or deflect to create a protrusion 107a or a recess 107b.

The embodiments of FIGS. 1A and 1B may be implemented together or separately. Specifically, the device 100 may be configured to produce a tactile output along the front surface (e.g., through the display and/or cover sheet), along the back surface (e.g., through the housing or enclosure), or along both the front and back surfaces of the device 100. While the examples of FIGS. 1A and 1B depict a local deformation, the device may be configured to produce a tactile or haptic output in accordance with any one or more of the following examples depicted below with respect to FIGS. 1C-1F.

Figure 1C:
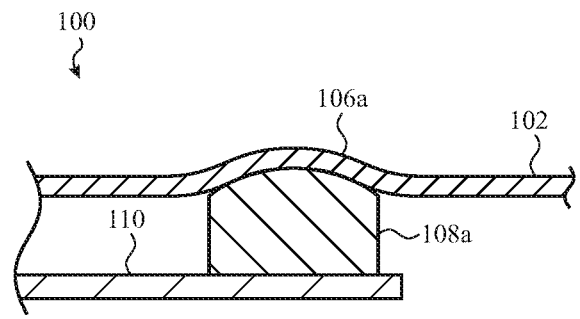
FIG. 1C illustrates a mechanism for producing a tactile output along a surface of an electronic device.
Figure 1D:
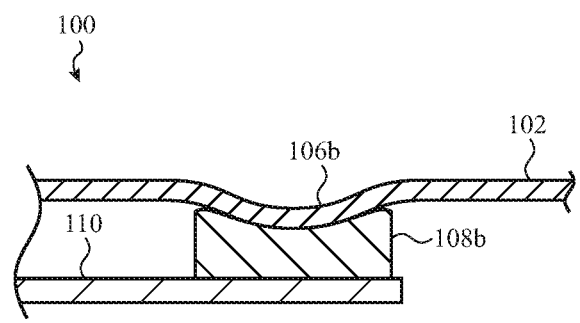
FIG. 1D illustrates a mechanism for producing a tactile output along a surface of an electronic device.

FIG. 1C and FIG. 1D depict cross-sectional views of the device of FIGS. 1A and 1B. In particular, FIGS. 1C and 1D illustrate how a haptic actuator may be used to create a localized deflection of the enclosure 102. FIG. 1C depicts a cross-sectional view A-A of FIG. 1A illustrating a localized deflection or protrusion 106a. FIG. 1D depicts a cross-sectional view B-B of FIG. 1A illustrating a localized deflection or recess 106b. In both of these examples, the enclosure 102 may be locally deformed to create the tactile output. The portion of the enclosure 102 may correspond to the cover sheet and/or display of FIG. 1A or the rear surface of the enclosure 102 of FIG. 1B. The haptic actuator, including in this example an arm 110 and an actuator tab 108, may be positioned within an interior volume defined by the enclosure 102 of the electronic device 100.

The localized deflection may be caused by the extension or actuator tab 108a, 108b exerting a contact force outward against an interior surface of the enclosure of the electronic device 100. As explained in more detail below, an actuator tab 108a, 108b may contact or otherwise interface with the interior surface of the electronic device 100 to cause the localized deflection. The actuator tab may be actuated or moved due to a bending or deflection of an arm 110 of a haptic actuator, which moves the actuator tab 108 along an actuation direction (e.g., vertically as depicted).

FIG. 1D shows an inward localized deflection 106b (e.g., dimple or recess) along an exterior surface of the enclosure, which may be tactically perceived by a user. The actuator tab 108 may be coupled to an inner surface or feature of the enclosure. For example, the actuator tab 108b may be coupled to the enclosure 102 by an adhesive or fastener so that a downward movement of the arm 110 of the haptic actuator causes a localized deflection or recess 106b.

Figure 1E:
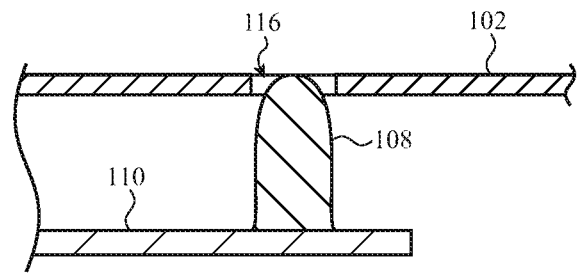
FIG. 1E illustrates a mechanism for producing a tactile output through holes in the surface of an enclosure of an electronic device.

FIG. 1E shows a side view of another embodiment configured to produce a tactile or haptic output at a surface 102 of an enclosure of an electronic device. The arm 110 and the actuator tab 108 are positioned beneath an opening 116 in the enclosure 102. Actuation that causes the arm 110 to move upward can cause the actuator tab 108 to extend through the opening 116. The extension of the actuator tab 108 through the opening 116 may be tactically perceived by the user. For example, the user may feel a top or upper portion of the actuator tab 108 that protrudes through the opening 116 using his or her finger. Alternatively, the actuator tab 108 may be moved downward or away from the external surface to define a depression or recess through the opening 116 that may be tactically perceived by the user.

Figure 1F:
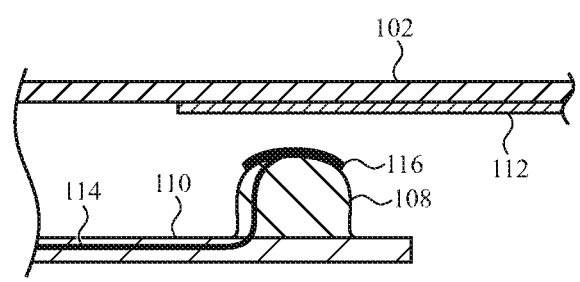
FIG. 1F illustrates a switch mechanism having a contact on a bendable arm.

FIG. 1F shows a side view of an embodiment of an alternate use of the haptic actuators disclosed herein in electronic devices, such as electronic device 100. Though the embodiment does not directly produce a tactile or haptic output on an enclosure of an electronic device, the actuation mechanisms may use various embodiments disclosed herein. FIG. 1F shows a configuration of an electrical switch having a first contact 112 on an underside of the enclosure 102 of the electronic device 100 and a second contact 114 on the surface of the nob or actuator tab 108. The haptic actuator may cause the arm 110 to deflect upwards to cause the switch to close. Alternatively, the first contact 112 and second contact 114 may be in contact at rest, so that a downward deflection of the arm 110 causes the switch to open. The second contact 114 extends through the arm 110 to other sections or components of the circuit.

Though the embodiments disclosed below are described with respect to an electronic device 100 of FIGS. 1A-1F, the embodiments are not limited to that application or specific implementations. For example, the haptic devices described herein may also be implemented on a variety of devices including, without limitation, notebook computers, tablet computers, desktop computers, portable display devices, wearable electronic devices (e.g., smart watches), personal digital assistants, braille readers, health monitoring devices, and the like.

Figure 2A:
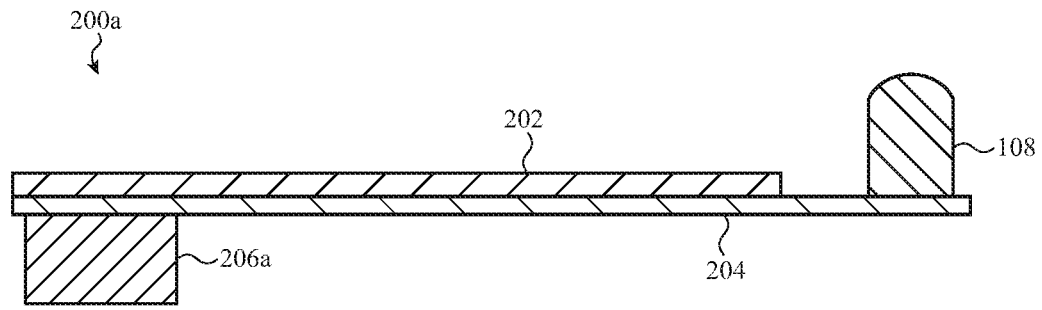
FIG. 2A illustrates an example actuator for producing a tactile output.
Figure 2B:
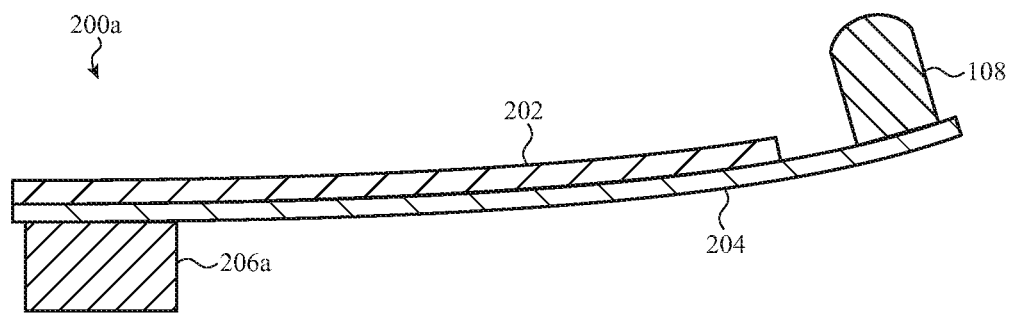
FIG. 2B illustrates an actuated state of the example actuator of FIG. 2A.

FIGS. 2A and 2B show an embodiment of a haptic actuator 200a having a one-sided piezoelectric configuration or structure. The one-sided piezoelectric structure shown includes a bendable elongated substrate 204 having an elongated dimension and a piezoelectric layer 202 positioned along a side of the elongated substrate 204. The piezoelectric layer 202 may be coupled (e.g., attached or fixed) with respect to the side of the elongated substrate 204. While shown as a flat planar section, the elongated substrate 204 may be shaped as an elongated round beam, or other elongated shape. The elongated substrate 204 may be made of an appropriate flexible material. In some embodiments, the flexible material can be stainless steel, aluminum, other metals or alloys, polymers, ceramics or other materials.

The elongated substrate 204 has a first end that is fixed with respect to the enclosure of the device. In this example, the elongated substrate 204 is attached to a support structure 206a which may form part of the enclosure or be attached to the enclosure. The elongated substrate 204 also has a second, free end that is free to move in an actuation direction. In some cases, the free end moves along a nonlinear path as the elongated substrate 204 bends or deflects. The elongated substrate 204 may also be described as a cantilever or cantilevered structure.

The haptic actuator 200a also includes an extension or actuator tab 108 positioned along an end of the elongated substrate 204. The actuator tab 108 may interface with or contact the enclosure to create a tactile output. Specifically, as described above with respect to FIGS. 1A-1F, the actuator tab 108 may be used to create a localized deformation or other feature that may be tactically perceptible to the user.

In the example of FIGS. 2A and 2B, the haptic actuator 200a includes a single piezoelectric layer 202 connected along a side of the elongated substrate 204. The piezoelectric layer 202 can be actuated by applying a voltage or other actuation signal to cause the piezoelectric material to either expand or contract in a direction substantially aligned with the length or elongated dimension of the elongated substrate 204. For example, a voltage may be applied to opposite ends of the piezoelectric layer 202. The voltage or electrical signal may be applied between a first end, located proximate to the support structure 206a, and a second end, located proximate the free end of the elongated substrate 204.

The piezoelectric layer 202 may be operatively coupled to control circuitry through a series of conductive traces or other type of electrical conduit. The electrical traces may be formed along or within the elongated substrate 204. The electrical connections can be implemented as a separate layer (e.g., a flexible substrate or flexible circuit) within the haptic actuator 200a. The control circuitry may be configured to apply an actuation signal (e.g., a voltage or a current signal) to the piezoelectric layer 202. A more detailed description of example control circuitry is provided below with respect to FIG. 10. In some embodiments, a first actuation signal, such as a first polarity of voltage, can cause a contraction of the piezoelectric layer 202, and a second actuation signal, such as the opposite polarity of voltage, can cause an expansion of the piezoelectric layer 202. Expansion and contraction of the piezoelectric layer 202 may cause the elongated substrate 204 to bend or deflect resulting in the free end of the elongated substrate 204 (and the actuator tab 108) to move along an actuation direction or nonlinear path.

FIG. 2B illustrates the haptic actuator 200a bent or deflected when the piezoelectric layer 202 is actuated by an actuation signal. In FIG. 2B, the actuation signal applied to the piezoelectric layer 202 has caused it to contract. The contraction then forces the elongated substrate 204 to bend towards the piezoelectric layer in response and move along an actuation direction or nonlinear path. This moves the extension or actuator tab 108 along an actuation direction from the rest position it had in the unactuated state shown in FIG. 2A. The amount of deflection or bend shown may be an exaggeration of that used in some embodiments. For small deflections, the displacement of the extension or actuator tab 108 may be substantially vertical.

However, due to the cantilevered support configuration, the actuator tab 108 may also be described as moving along a nonlinear path.

Figure 2C:
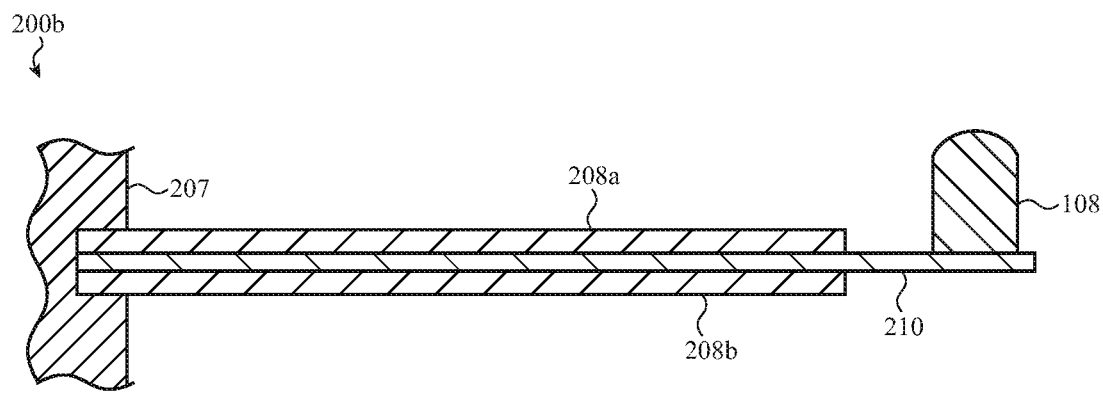
FIG. 2C illustrates another example actuator for producing a tactile output.
Figure 2D:
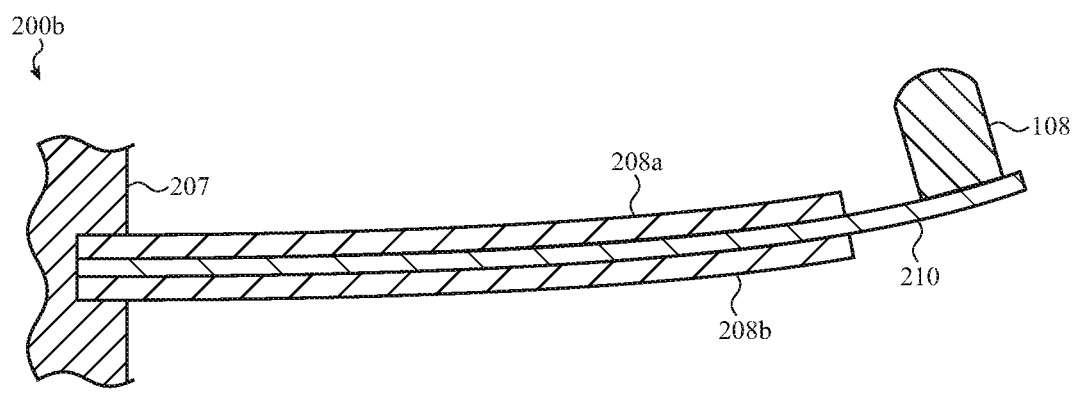
FIG. 2D illustrates an actuated state of the example actuator of FIG. 2C.

FIGS. 2C-D show an embodiment of a haptic actuator 200b having a two-sided piezoelectric configuration or structure. In the two-sided piezoelectric structure shown, the haptic actuator 200b includes a flexible elongated substrate 210. As with the elongated substrate 204 of FIG. 2A, the elongated substrate 210 may be shaped as a flat planar section, an elongated round beam, or other elongated shape. Similarly, the elongated substrate 210 may be made of an appropriate flexible material such as stainless steel, another metal, a flexible plastic or other material.

In the two-sided piezoelectric structure of FIG. 2C there are two piezoelectric layers positioned along and/or attached to opposite sides of the elongated substrate 210. A first piezoelectric layer 208a is attached along a first side of the elongated substrate 210, and a second piezoelectric layer 208b is attached to another side of the elongated substrate 210. In the embodiment shown, the piezoelectric layers 208a, 208b are on opposite sides of the elongated substrate 210, and are approximately equal in length in order to provide balanced forces in each direction. Other embodiments may use different positions and lengths for a pair of piezoelectric layers.

The haptic actuator 200b also includes a support structure 207 to which a first end of the elongated substrate 210 is fixed. The opposite end is free to move along a nonlinear path formed as the elongated substrate 210 pivots or bends about the fixed first end. At the opposite end of the elongated substrate 210 is a pin, actuator tab 108, or other structure that can create a haptic or tactile sensation along a surface of an enclosure of an electronic device when haptic actuator 200b is actuated. The piezoelectric layers 208a, 208b may be attached to the support structure 207 or, in an alternative embodiment the piezoelectric layers 208a, 208b are separated from the support structure 207 by a gap or space. In the particular embodiment shown if FIG. 2C, both the piezoelectric layers 208a, 208b and the elongated substrate 210 extend into the support structure 207. As with the haptic actuator 200a, electrical traces, an electrical conduit (e.g., a flex circuit) or other electrical connection may be used to operably couple the piezoelectric layers 208a, 208b to control circuitry that is configured to apply an actuation signal(s) to the piezoelectric layers 208a, 208b. The electrical connections may be through or on the elongated substrate 210. Alternatively, the electrical connections can be implemented as a separate component (e.g., a flex circuit, printed circuit board, or wires) that are electrically coupled to the piezoelectric layers 208a, 208b.

In some implementations, the two piezoelectric layers 208a, 208b may be configured to receive respective complementary actuation signals that cause one to contract and the other to expand. The complementary actuation signals may exert two bending forces along the elongated substrate 210 causing it to bend or deflect along an actuation direction (e.g., along a nonlinear path). In the situation shown in FIG. 2C, the actuation direction is transverse to a length of the elongated substrate 210 (e.g., substantially vertical, as depicted). When no signals or balanced signals are applied to the two piezoelectric layers 208a, 208b, the elongated substrate 210 may remain in a stable equilibrium position in which the elongated substrate 210 is un-deflected or substantially straight.

FIG. 2D depicts the haptic actuator 200b in an actuated state. Specifically, in FIG. 2D, the top piezoelectric layer 208a may be actuated to contract into a contracted state, and the bottom piezoelectric layer 208b may be actuated to expand into an expanded state. As a result of the actuation of the piezoelectric layers 208a, 208b, the elongated substrate 210 may bend or deflect resulting in the free end (and the actuator tab 108) moving in an actuation direction that is transverse to the length or elongated dimension of the elongated substrate 210. Due to the cantilevered support, the actuation may cause a movement of the free end (and the actuator tab 108) that is along a nonlinear path. For sufficiently small movements, the path may be substantially vertical or almost linear.

Figure 2E:
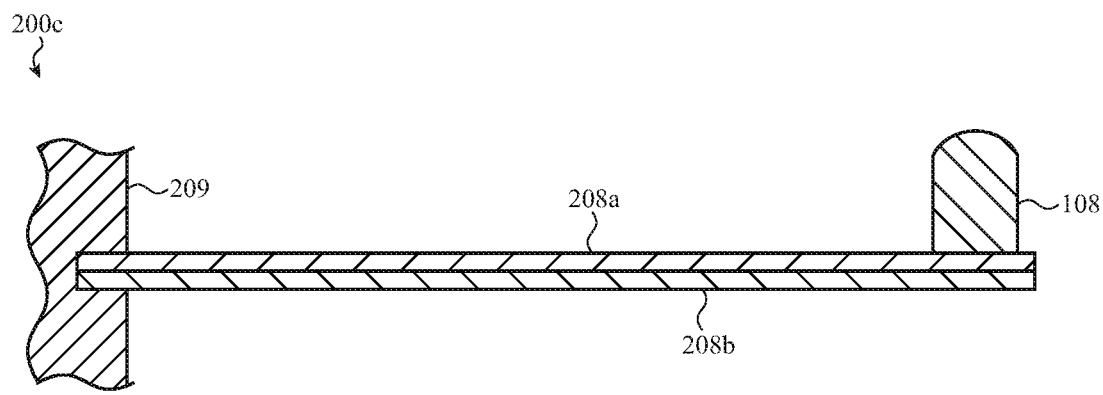
FIG. 2E illustrates another example actuator for producing a tactile output.
Figure 2F:
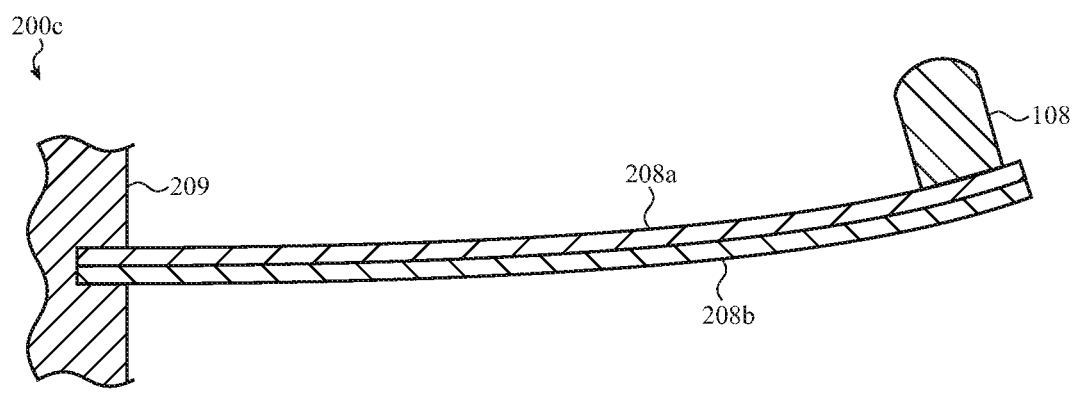
FIG. 2F illustrates an actuated state of the example actuator of FIG. 2E.

FIGS. 2E and 2F depict an alternative embodiment 200c of the haptic actuator 200b shown in FIGS. 2C-D. As with the haptic actuator 200b, the haptic actuator 200c has at least two piezoelectric layers, 208a, 208b, as in FIGS. 2C-D. However, the haptic actuator 200c lacks the elongated substrate 210 in haptic actuator 200b. The two piezoelectric layers 208a and 208b are coupled or linked to form a single beam that bends or deflects. The direction of the bending is determined by the signals applied to the two piezoelectric layers 208a and 208b. When a first signal applied to piezoelectric layer 208a causes it to contract, and a second signal applied to the second piezoelectric layer 208b causes it to expand, the single beam deflects upwards, as depicted in FIG. 2F. The piezoelectric layers 208a and 208b may be formed from a variety of piezoelectric materials. In some instances, one or both of the piezoelectric layers 208a and 208b may include a ceramic material that may provide a specific amount of stiffness to the beam or actuator. In some implementations, each of the two piezoelectric layers 208a and 208b may separately include multiple layers of one or more piezoelectric materials. In multi-layer configurations, the respective multiple layers associated with either of the piezoelectric layers 208a, 208b may be configured and/or electrically coupled to bend in the same direction as the other layers in either of the piezoelectric layers 208a, 208b in response to an actuation signal.

As shown in FIGS. 2E and 2F, the actuator tab 108 is positioned toward the end of the beam formed by the linked piezoelectric layers 208a and 208b. The two linked piezoelectric layers 208a and 208b are supported at one end at support structure 207. The signal connections to piezoelectric layers 208a and 208b may through or support structure 207.

The examples of FIGS. 2A-2F are provided by way of illustration and are not intended to be limiting in nature. With respect to the example haptic actuators 200a, 200b, and 200c, and in the following embodiments, variations of the shapes, positions, connections, and other properties of the piezoelectric layers, the elongated substrates and other components of haptic actuators may vary depending on the limitation and are considered within the scope of this disclosure.

As described in the examples of FIGS. 3A-9, the movement of a haptic actuator may be augmented so that the displacement and/or the force applied by movement of their free ends is increased, which may result in an improved or enhanced haptic or tactile output. As described in the following examples, the augmentation can be accomplished by various combinations of magnets, magnetic structures, and ferritic plates configured to apply additional or augmenting forces along the actuation direction. When such augmenting forces are applied towards the free end of an elongated substrate, a torque about the fixed end occurs, helping to deflect, bend, or move the elongated substrate.

Figure 3A:
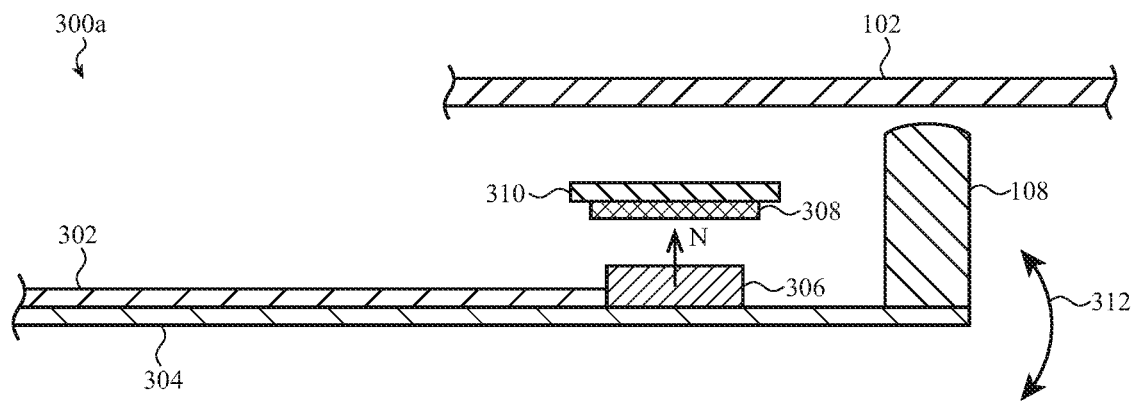
FIG. 3A illustrates a side view of a haptic actuator with magnetic augmentation.

FIG. 3A is a cross section illustration of a first embodiment of certain components of a haptic actuator 300a. The haptic actuator 300a includes a one-sided piezoelectric structure that includes an elongated substrate 304, such as described above, and a piezoelectric layer 302 positioned along and/or attached to a side of the elongated substrate 304. The support structure (omitted from this figure) fixes a first, fixed end of the elongated substrate 304 with respect to an enclosure or housing. The elongated substrate 304 also has a second, free end that is opposite to the fixed end and is free to move along an actuation direction 312 in response to an activation or actuation of the piezoelectric layer 302 by, for example, an actuation signal. At the free end is shown an actuator tab 108 or pin, such as described above, shown able to locally deflect an external surface of an enclosure 102 (e.g., a housing, cover sheet, cover glass) of the electronic device.

A magnetic element 306 is connected (e.g., attached) to the elongated substrate 304 proximate to the free end. The connection may be made by adhesive layers, by physical links such as screws or bolts, or by magnetic attraction between the magnetic element 306 and ferromagnetic material in the elongated substrate 304. The magnetic element 306 may comprise one or more individual magnets. In some embodiments, the magnetic element 306 is a single permanent magnet and may include one or more elements formed from a ferromagnetic material. In other embodiments, the magnetic element 306 may comprise multiple individual magnets, such as in a Halbach array discussed below. In other embodiments, the magnetic element 306 may be an electromagnet, such as produced by a wire coil. In the illustrative embodiment shown, the magnetic element 306 is a single permanent magnet having a magnetic pole oriented perpendicular to the long axis of the elongated substrate 304. In some embodiments, the magnetic element 306 may be positioned at or closer to the free end than the actuator tab 108.

Positioned near the magnetic element 306 is a ferritic plate 308. The ferritic plate 308 may include a ferromagnetic metal or alloy, such as steel alloys, ALNICO, nickel or cobalt alloys, or others. The ferritic plate 308 is positioned near the magnetic element 306 to define a gap or space between the ferritic plate 308 and the magnetic element 306. The ferritic plate 308 is attached to a support component 310 (which may be formed within or attached to the enclosure) of the electronic device so that the ferritic plate 308 remains stationary during actuation of the piezoelectric layer 302 and movement of the elongated substrate 304.

The magnetic element 306 experiences an attractive magnetic force toward the ferritic plate 308, which is then felt by the elongated substrate 304 due to its connection to the magnetic element 306. This magnetic force is in addition to any force applied by actuation of the piezoelectric layer 302. The closer the magnetic element 306 and ferritic plate 308 are positioned towards the free end of the elongated substrate 304, the greater the torque is about its fixed end, and hence the greater the potential motion in the actuation direction 312.

In the configuration shown in FIG. 3A, if the piezoelectric layer 302 is actuated to contract, the elongated substrate 304 then bends or moves upwards at the free end. In doing so, the gap between the magnetic element 306 and the ferritic plate 308 is reduced. By reducing the gap, the magnetic force between the magnetic element 306 and the ferritic plate 308 increases. This increase in force in the direction of motion is analogous physically to a spring with a negative spring constant, i.e., an increase in deflection in one direction increases a force in the direction of the deflection rather than opposite to the direction of deflection. Without the magnetic element 306 and the ferritic plate 308, bending of the elongated substrate 304 caused by actuating the piezoelectric layer 302 would induce the material of the elongated substrate 304 to exert a restoring force to counteract the bending. In contrast, the increase in magnetic force between the magnetic element 306 and the ferritic plate 308 as they near each other induces a force in the direction of the bending. As a result, the restoring force produced by the elongated substrate 304 when deflected is counteracted, and the motive force caused by the piezoelectric layer 302 is augmented. This can cause the actuator tab 108 to apply a greater force on the enclosure 102, for improved haptic or tactile output.

In a one-sided piezoelectric structure, as in FIG. 3A, there may be some residual force between the magnetic element 306 and the ferritic plate 308 even when the haptic actuator 300a is not actuated and the elongated substrate 304 is not deflected by the piezoelectric layer 302. This residual force may result in a slight deformation or bending of the elongated substrate 304 toward the ferritic plate 308. Additionally and/or alternatively, a de-actuation signal can be applied to the piezoelectric layer 302. Such a de-actuation signal may cause the piezoelectric layer 302 to expand slightly and cause the elongated substrate 304 to deflect (downward) so as to move the magnetic element 306 away from the ferritic plate 308. The resulting counteracting force produced on the elongated substrate 304 may keep the elongated substrate 304 in an un-deflected position until there is a need to cause a haptic or tactile output.

The amount of the magnet force produced between the magnetic element 306 and the ferritic plate 308 can be selected based on the application of the electronic device 100. In some embodiments, the magnetic force may not overcome the restoring force, so the elongated substrate 304 will have a single stable equilibrium position or state, having only some deflection and the gap only somewhat reduced. As described above, the position of the elongated substrate 304 can be adjusted by having the piezoelectric layer 302 apply a force so that one elongated substrate 304 has no deflection.

Alternatively, for a sufficiently strong magnetic force between the magnetic element 306 and the ferritic plate 308, the natural restoring force caused by bending the elongated substrate 304 may be overpowered, leading to an alternate equilibrium position or state in which the magnetic element 306 and the ferritic plate 308 are in contact, or a physical stop component prevents the magnetic element 306 from contacting the ferritic plate 308, or enough deflection of the elongated substrate 304 occurs to counterbalance the magnetic force. The haptic actuator 300a may be displaced from the equilibrium position or state by applying a counteracting force by actuating the piezoelectric layer 302. Such a situation could be used when it is desired to produce a sustained protrusion or bump along the surface of the enclosure 102 that does not require an actuation signal or other input in order to produce the tactile output. A biased equilibrium position may also be used in combination with the switch configuration of FIG. 1F to provide a sustained contact when the haptic actuator 300a is in a passive or resting state.

Figure 3B:
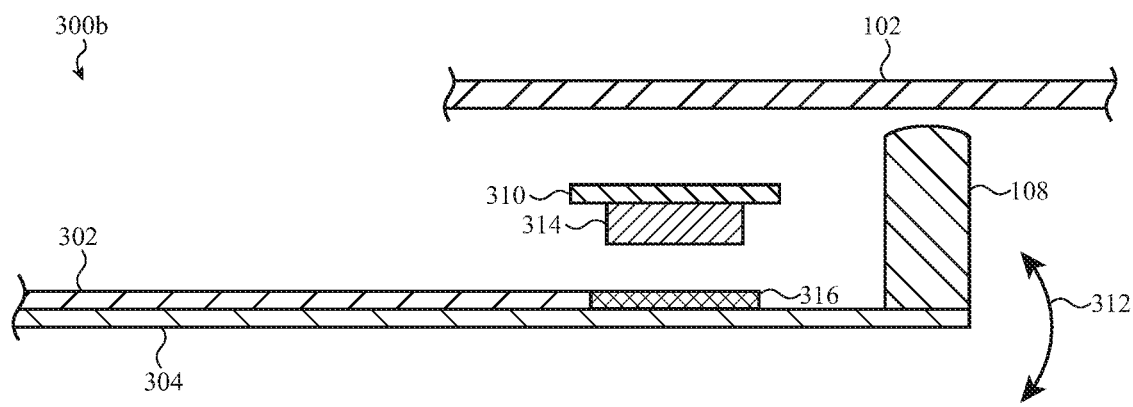
FIG. 3B illustrates a side view of a haptic actuator with magnetic augmentation.

FIG. 3B is a cross section illustration of a second embodiment of certain components of a haptic actuator 300b. The embodiment illustrated in FIG. 3B is a variant of that of FIG. 3A: it has the one-sided piezoelectric configuration for the elongated substrate 304 and the piezoelectric layer 302; and the actuator tab 108 creates a haptic or tactile output on the exterior surface of an enclosure 102, as described above. As in FIG. 3A, the elongated substrate 304 can be deflected or moved in the actuation direction 312 by activation or actuation of the piezoelectric layer 302.

The embodiment of FIG. 3B differs from that of FIG. 3A in that a ferritic plate 316 is attached to the elongated substrate 304, and a magnetic structure 314 is attached to the support component 310. The configuration and operations described above for the haptic actuator 300a also apply to the haptic actuator 300b.

The embodiments of FIGS. 3A-B may have various advantages. The haptic actuator 300A, for example, may need less adhesive to affix the magnetic element 306 to the elongated substrate 304 when the latter includes a ferromagnetic material. The configuration of haptic actuator 300b, for example, may allow for easier use of an electromagnetic coil as the magnetic structure 314. Other advantages will be apparent to one of skill in the art.

Figure 4A:
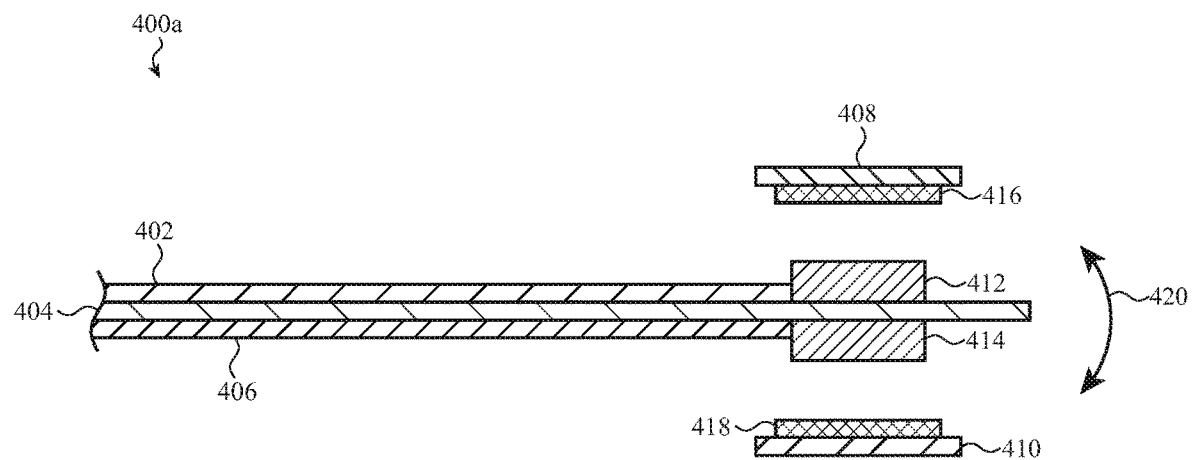
FIG. 4A illustrates a side view of a haptic actuator with magnetic augmentation.

FIG. 4A is a cross section view of another example haptic actuator 400a. The haptic actuator 400a is configured with a two-sided piezoelectric structure having a flexible or bendable elongated substrate 404, a first piezoelectric layer 402 attached and/or coupled to the elongated substrate 404 along one side, and a second piezoelectric layer 406 attached and/or coupled to the elongated substrate 404 along a second side. In this embodiment, the second side is opposite to the first side. This two-sided piezoelectric structure may operate similar to as described above with respect to FIG. 2C. For clarity, the support structure of the haptic actuator 400a that anchors one end of the elongated substrate 404 is not shown, but is assumed to be at the left side of the two-sided piezoelectric structure. The haptic actuator 400a also has an extension or actuator tab (e.g., actuator tab 108), such as described above, connected to the free end of the cantilever beam formed by the elongated substrate 404, but it is not shown for clarity of exposition.

The first and second piezoelectric layers 402, 406, may be connected to a control unit capable of applying various respective actuation signals to each. The actuation signals provided by the control unit may be voltages to cause the first and second piezoelectric layers 402, 406 to expand or contract so that the elongated substrate 404 bends or moves in a desired direction. Alternatively, the signals provided by the control unit may cause the first and second piezoelectric layers 402, 406 to expand or contract to hold the elongated substrate 404 in a level position. The two-sided piezoelectric structure of haptic actuator 400a may operate as described above in relation to the embodiment of FIGS. 2C and 2D or the two-sided piezoelectric structure of FIGS. 2E and 2F to move the elongated substrate 404 in the actuation direction 420.

A first magnet structure 412 is affixed to the first side of the elongated substrate 404. A second magnet structure 414 is affixed to the second side of the elongated substrate 404, opposite to the first magnet structure 412. In the embodiment shown, the magnet structures 412 and 414 are positioned at equal distances along the length of the elongated substrate 404, but on opposite sides. However, in other embodiments, the magnet structures 412 and 414 may be positioned at different distances along the length of the elongated substrate 404.

A ferritic plate 416 is positioned near the magnet structure 412 and separated by a gap. The ferritic plate 416 is attached to support component 408 that holds the ferritic plate 416 stationary with respect to the electronic device. Similarly, a ferritic plate 418 is positioned near the magnet structure 414 and separated by a gap. The ferritic plate 418 is attached to support component 410 that holds the ferritic plate 418 stationary with respect to the electronic device.

The two-sided piezoelectric structure shown in FIG. 4A allows the elongated substrate 404 and its attached first and second piezoelectric layers 402 and 406 to have an undeflected equilibrium position or state when the magnetic force between the first magnet structure 412 and the ferritic plate 416 is matched by the magnetic force between the second magnet structure 414 and the ferritic plate 418, and there is no force caused by an actuation of either piezoelectric layer.

When actuation signals are sent to the first and second piezoelectric layers 402 and 406 so that the elongated substrate 404 deflects, e.g., toward the ferritic plate 416, the gap between the first magnet structure 412 and the ferritic plate 416 decreases, increasing the magnetic force on the elongated substrate 404. At the same time, the gap between the second magnet structure 414 and the ferritic plate 418 increases, decreasing the oppositely directed magnetic force of attraction between them. This further increases the force deflecting the elongated substrate 404 upward.

In general, the elongated substrate 404 produces a restoring force to counteract a deflection. If this restoring force is sufficiently large, the haptic actuator 400a may have a single stable equilibrium position or state in which the elongated substrate 404 is substantially equidistant from the two ferritic plates 416, 418. The haptic actuator 400b may have a similar single stable equilibrium position in which the elongated substrate 404 is substantially equidistant from the magnetic structures 422, 424. The single stable equilibrium position may be due to a balance or equilibrium of a first magnetic force between the first magnet structure 412 and the ferritic plate 416 and a second magnetic force between the second magnet structure 414 and the ferritic plate 418. A similar equilibrium may be achieved between a first magnetic force between the magnetic structure 422 and the ferritic plate 426 and a second magnetic force between the magnetic structure 424 and the ferritic plate 428.

In some embodiments, the haptic actuators 400a, 400b may have two or more stable equilibrium positions or states. For example, if the elongated substrate 404 produces a weaker restoring force when deflected, the haptic actuator 400a may be maintained in one of two stable equilibrium positions. In a first equilibrium position the elongated substrate 404 may be deflected toward the ferritic plate 416 far enough that the restoring force is overcome by the magnetic force between the ferritic plate 416 and the first magnetic structure 412. In some cases, the restoring force is substantially equal to the magnetic force between the ferritic plate 416 and the first magnetic structure 412 resulting in a maintained gap between the first magnet structure 412 and the ferritic plate 416. In some implementations, a component or structural feature may limit the deflection of the elongated substrate 404 to prevent contact between the components. Similarly, a second stable equilibrium position may be achieved when the elongated substrate 404 is deflected toward the ferritic plate 418 far enough that the restoring force overcomes or balances with the magnetic forces. Similarly, the second stable equilibrium position may result in no contact between the second magnet structure 414 and the ferritic plate 418 due to a balance between the forces or due to a component or structural feature that limits the deflection of the elongated substrate 404. Actuation of the first and second piezoelectric layers 402, 406 by actuation signals can be used to toggle the elongated substrate 404 between the two equilibrium states. In some implementations, the elongated substrate 404 may also be maintained in a third (balanced) equilibrium position in which the free end of the elongated substrate 404 is equidistant to the ferritic plates 416, 418. The elongated substrate 404 may be maintained in this third equilibrium position until one or both of the first and second piezoelectric layers 402, 406 are actuated or activated or actuated by respective actuation signals. While this example is provided with respect to the haptic actuator 400a of FIG. 4A, the sample principle can be allowed to the haptic actuator 400b of FIG. 4B.

Figure 4B:
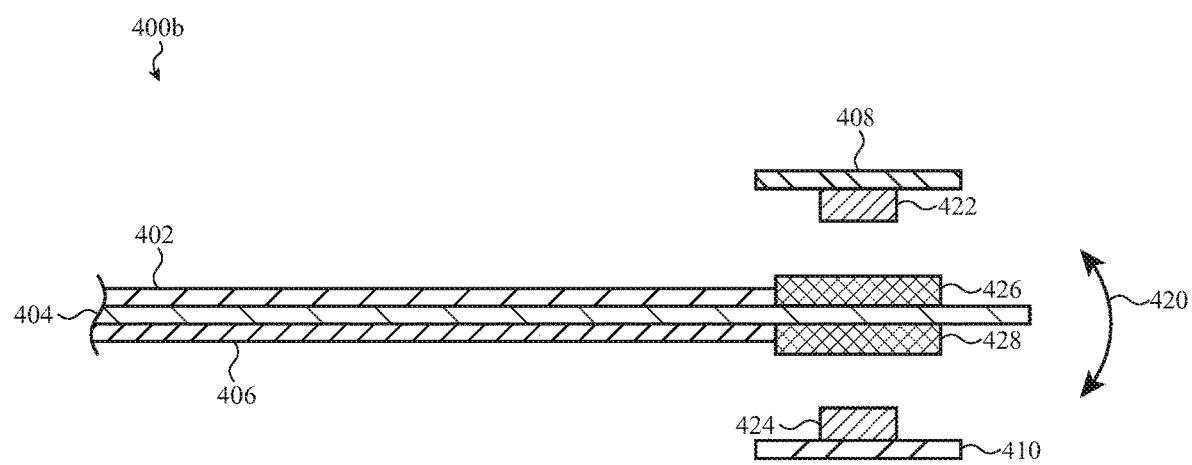
FIG. 4B illustrates a side view of a piezoelectric structure with magnetic augmentation.

FIG. 4B is a cross-sectional illustration of another example haptic actuator 400b. The embodiment illustrated in FIG. 4B is a variant of that of FIG. 4A: it has a two-sided piezoelectric structure, including the elongated substrate 404 and the first and second piezoelectric layers 402, 406. As in FIG. 4A, the elongated substrate 404 is can be deflected or moved in the actuation direction 420 by actuation of the first and second piezoelectric layers 402, 406.

The embodiment of FIG. 4B differs from that of FIG. 4A in that a ferritic plate 426 is attached on a first side of the elongated substrate, and a ferritic plate 428 is attached to the elongated substrate 404 on a second side that is opposite to the first side. Also, a magnetic structure 422 is attached to the support component 408, and a magnetic structure 424 is attached to the support component 410. The configuration and operations described above for the haptic actuator 400a also apply to the haptic actuator 400b.

Figure 5A:
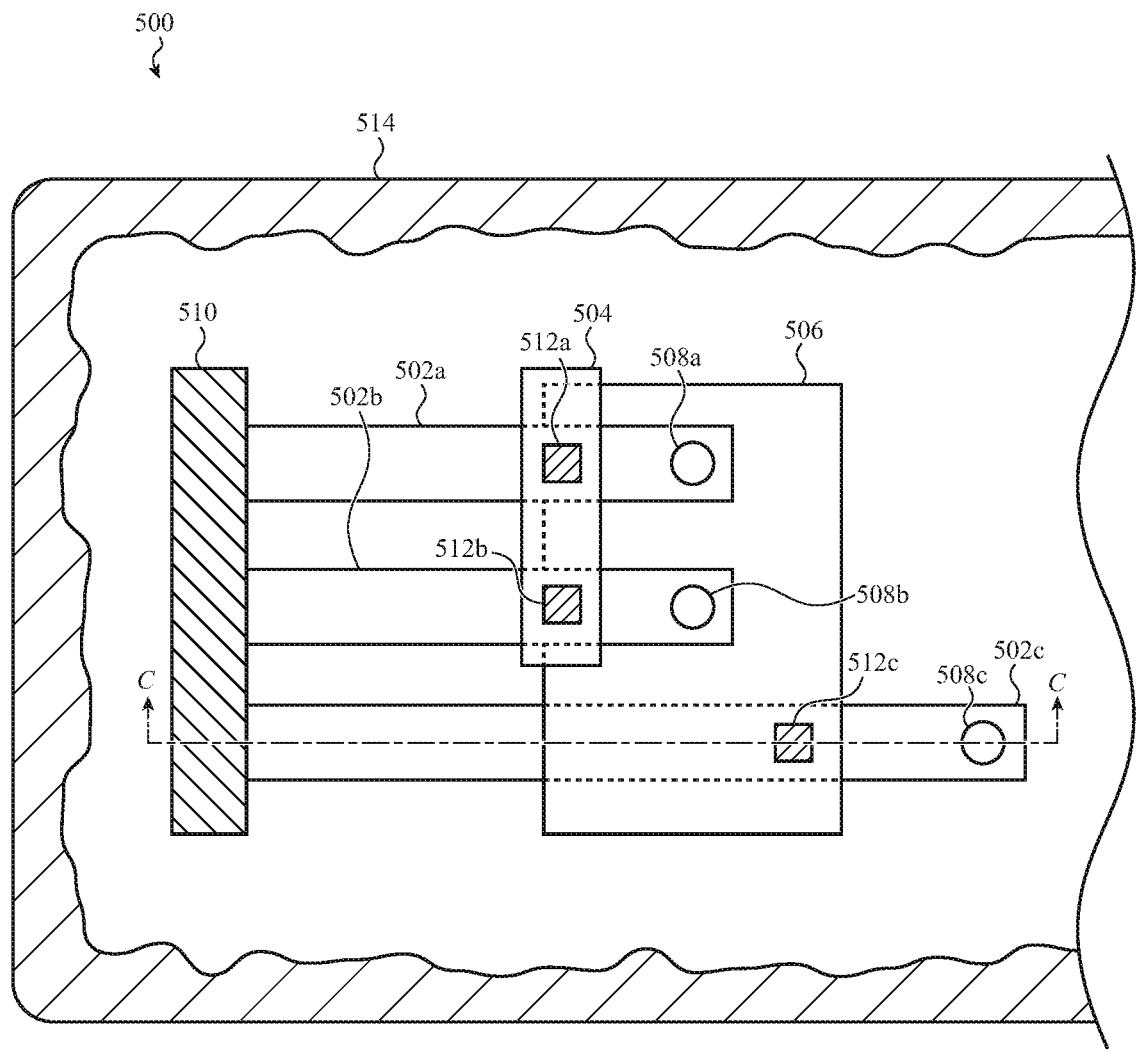
FIG. 5A illustrates a cutaway top view through an enclosure of an electronic device with a haptic actuator having an array of piezoelectric structures.

FIG. 5A shows a cut-away view through an enclosure 514 of an electronic device 500 showing a haptic actuator having an array of multiple piezoelectric structures 502a, 502b, 502c. Each of piezoelectric structures 502a, 502b, 502c comprises a flexible elongated substrate having at least one piezoelectric layer, configured according to any of the embodiments described above. Each of piezoelectric structures 502a, 502b, 502c may be independently deflected, as described above. Such a haptic actuator may be used to create patterns or codes of haptic or tactile outputs at or on the surface of the enclosure 514 of the electronic device 500.

The haptic actuator includes a support structure 510 that serves to fix one end of each of the piezoelectric structures 502a, 502b, 502c. Some embodiments may use more than one support structure for the piezoelectric structures 502a, 502b, 502c. The piezoelectric structures 502a, 502b, 502c can have respective actuator tabs 508a, 508b, 508c positioned near their free ends, which may have different sizes or shapes.

The haptic actuator is configured to have the piezoelectric structures 502a, 502b, 502c arranged in parallel and offset to define multiple levels. In other embodiments, the piezoelectric structures may be arranged in a single level. The haptic actuator includes a first ferritic plate 504, of materials as described above, positioned to extend above (as per the top view orientation) the piezoelectric structures 502a, 502b. Each of piezoelectric structures 502a, 502b has a magnet structure, respectively 512a, 512b, positioned on its side facing the ferritic plate 504. The haptic actuator includes a second ferritic plate 506 positioned below the piezoelectric structures 502a, 502b but above piezoelectric structure 502c. The piezoelectric structure 502c has a magnet structure 512c positioned on its side facing the ferritic plate 506.

Figure 5B:
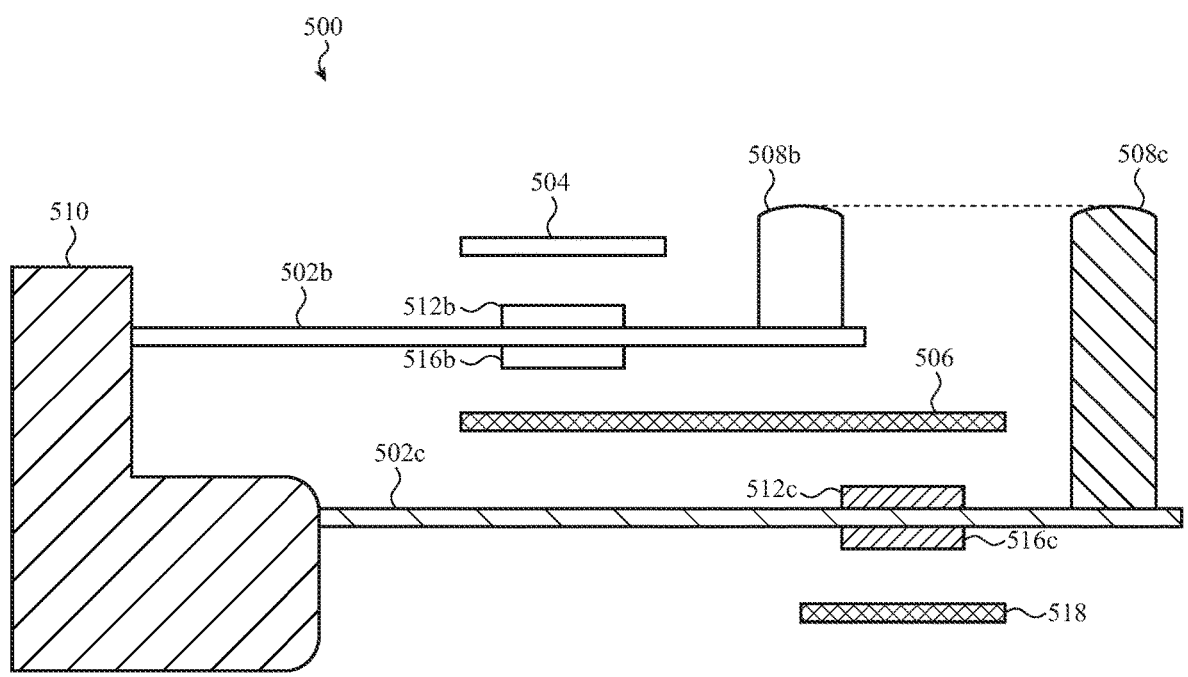
FIG. 5B illustrates a side view of the haptic actuator array of FIG. 5A.

FIG. 5B depicts a cross-sectional view of the haptic actuator of the electronic device 500 along section C-C of FIG. 5A. The piezoelectric structures 502a, 502b, 502c may be implemented as one-sided or two-sided piezoelectric structures, consistent with embodiments described herein. Note that in the cross-sectional view of FIG. 5B, the piezoelectric structure 502a is not seen as it is on the same level as, and hidden by, piezoelectric structure 502b in the foreground. Magnet structures 512b, 512c are on respective top sides of piezoelectric structures 502b, 502c, and magnet structures 516b, 516c are on the corresponding bottom sides of piezoelectric structures 502b, 502c. In the embodiment shown, actuator tabs 508b, 508c are shaped so that the tops of each have substantially the same distance from the surface when there is no actuation of any piezoelectric layers, though this is not necessary.

The ferritic plate 504 is positioned above magnet structure 512b to create an attraction force. (Support components for ferritic plates 504 and 506 are omitted for clarity.) The ferritic plate 506 is positioned on a level between the levels of piezoelectric structures 502b, 502c. Thus, magnet structures 516b and 512c experience attractive forces toward ferritic plate 506. Also, another ferritic plate 518 is positioned beneath magnet structure 516c.

The piezoelectric structures 502a, 502b, 502c may be actuated separately through electrical connections from a control unit of the haptic actuator. Such a control unit may direct actuation signals to the piezoelectric structures 502a, 502b, 502c to cause the piezoelectric structures 502a, 502b, 502c to move independently to produce multiple different haptic or tactile outputs or patterns on a surface of the electronic device. The haptic actuator may operate the piezoelectric structures 502a, 502b, 502c as described above.

Figure 6:
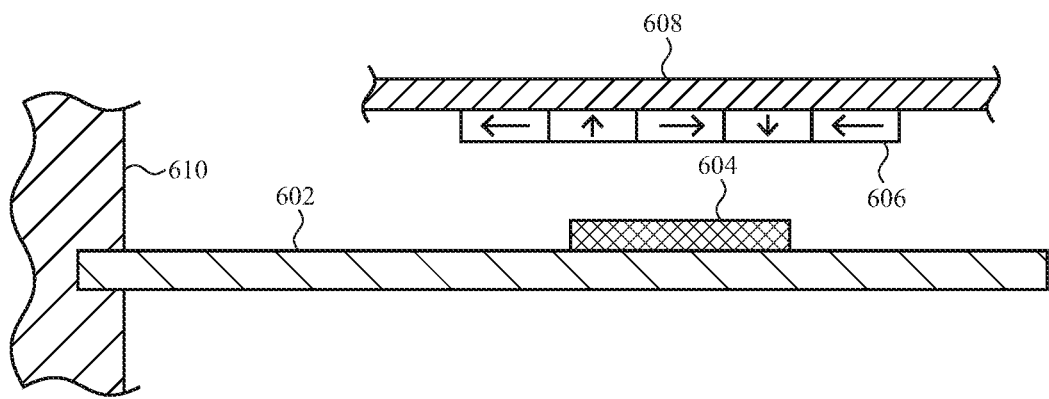
FIG. 6 illustrates a side view of a piezoelectric structure having a Halbach array of magnets for magnetic augmentation.

FIG. 6 is a cross section illustration of a configuration of a haptic actuator, such as those of either FIG. 3B or FIG. 4B, in which a ferritic plate is attached along a flexible elongated substrate. In the embodiment of FIG. 6, the cantilever beam 602 includes the elongated substrate and at least one piezoelectric layer, as described above. A ferritic plate 604 is attached to the cantilever beam 602 and separated by a gap from a magnet structure 606. The magnet structure 606 is supported near the ferritic plate 604 by a support component 608. The configuration shown in FIG. 6 may be only part of a two-sided piezoelectric structure. That is, there may be a respective analog of the ferritic plate 604, the magnet structure 606, and the support component 608 positioned on the opposite side of the cantilever beam 602 to form a two-sided piezoelectric structure as in FIG. 4B.

In the embodiment shown in FIG. 6, the magnet structure 606 is implemented as a Halbach array. Note that while a one-sided piezoelectric structure is shown, it is clear that both magnets in a two-sided piezoelectric structure may also use a Halbach array. A Halbach array contains a sequence of individual magnets, shown as the sections of magnet structure 606, with north poles that are successively rotated by 90 degrees (positioned orthogonally) along an axis, as shown by the arrows within each section. The sections are typically cubic in shape, though this is not required, with the north magnetic poles directed perpendicular to cube face. As a whole, a Halbach array is typically shaped as a parallelepiped with four side faces and two end faces. The long axis of the Halbach array of FIG. 6 is parallel to the long axis of the cantilever beam 602. An advantage to using a Halbach array for the magnet structure 606 is that the Halbach array produces a strongest magnetic field extending from one of the side faces of the array, and much reduced magnetic fields from the opposite face and remaining side faces. By orienting the face of the Halbach array producing the strongest magnetic field toward the ferritic plate 604, a strong attraction force between the ferritic plate 604 and the magnet structure 606 is produced, while at the same time reducing magnetic fields that would enter the support component 608 and possibly exit into the enclosure of the electronic device. Further, the support component 608 may be a ferritic metal to provide a path or shunt for the magnetic fields that are not directed toward the ferritic plate 604.

Figure 7:
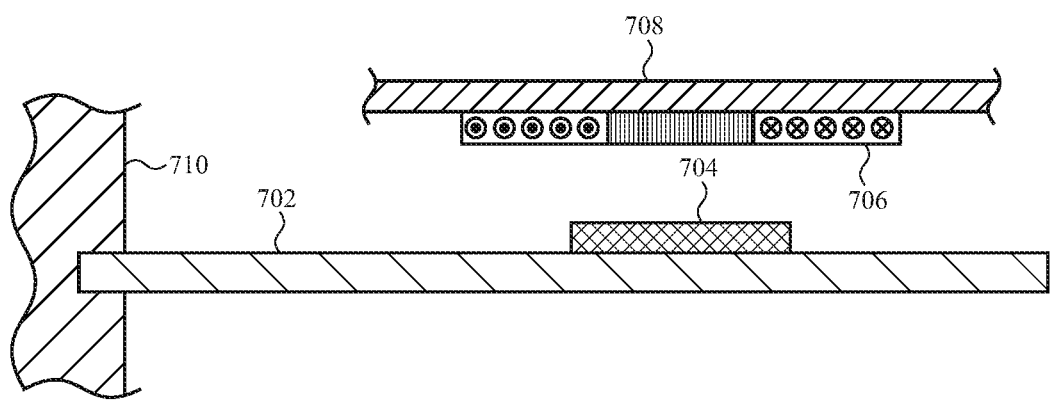
FIG. 7 illustrates a side view of a piezoelectric structure having an electromagnet for magnetic augmentation.

FIG. 7 is a cross section illustration of a configuration of a haptic actuator, such as those of either FIG. 3B or FIG. 4B, in which a ferritic plate is attached along an elongated substrate. Note that while a one-sided piezoelectric structure is shown, it is clear how the configuration can be adapted for a two-sided piezoelectric structure. In the embodiment of FIG. 7, the cantilever beam 702 includes the elongated substrate and at least one piezoelectric layer, as described above. A ferritic plate 704 is attached to the cantilever beam 702 and separated by a gap from a magnet structure 706. The magnet structure 706 is supported near the ferritic plate 704 by a support structure 708. The configuration shown in FIG. 7 may be only part of a two-sided piezoelectric structure. That is, there may be a respective analog of the ferritic plate 704, the magnet structure 706, and the support structure 708 positioned on the opposite side of the cantilever beam 702 to form a two-sided piezoelectric structure as in FIG. 4B.

In the embodiment shown in FIG. 7, the magnet structure 706 is implemented as an electromagnet formed as a coil of wires. The wires and their respective current flow directions are indicated with the standard convention for the circles in the sections of the magnet structure 706. A space within the coils may be open, or may contain a ferromagnetic material. The electrical connections of the electromagnet to control circuitry providing the current may be within or on the support structure 708.

Advantages of the configuration shown in FIG. 7 include being able to vary the magnetic force between the ferritic plate 704 and the magnet structure 706 by varying the current applied. Further, applying no current to the electromagnet results in no magnetic attraction. When the cantilever beam 702 has a one-sided piezoelectric structure, the cantilever beam 702 can be un-deflected when no actuation of the piezoelectric layer is applied.

Figure 8:
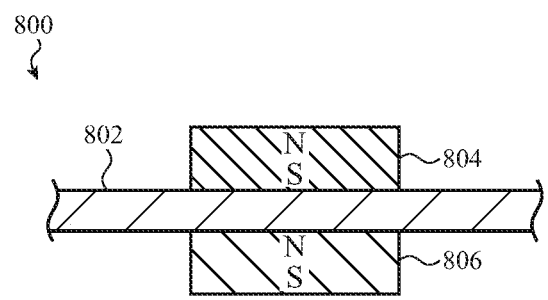
FIG. 8 illustrates a configuration of magnets on a piezoelectric structure.

FIG. 8 is a cross section illustration of part of a haptic actuator 800 having a two-sided piezoelectric structure 802 positioned as a cantilever beam. Two magnet structures 804 and 806 are on opposite sides of the piezoelectric structure 802. The piezoelectric structure 802 may contain two piezoelectric layers and an elongated substrate as described previously. FIG. 8 illustrates that when two magnet structures 804 and 806 are placed at or nearly equidistant along the two-sided piezoelectric structure 802 and have their north magnetic poles oriented in the same direction and transverse to the long length of the piezoelectric structure 802, then there can be a magnetic attraction across the piezoelectric structure 802 between the south pole of the magnet structure 804 and the north pole of the magnet structure 806. This attraction can help affix the magnet structures 804 and 806 to the piezoelectric structure 802. Another advantage, such as for a haptic actuator with the configuration shown in FIG. 4A, is that connecting the ferritic plates 416 and 418 with a ferritic material can form a completed path for the magnetic flux from the magnet structures 804 and 806. This can serve to reduce magnetic fields within the enclosure of the electronic device using such a haptic actuator. This may also function to reduce interference with other electrical components of the electronic device.

Figure 9:
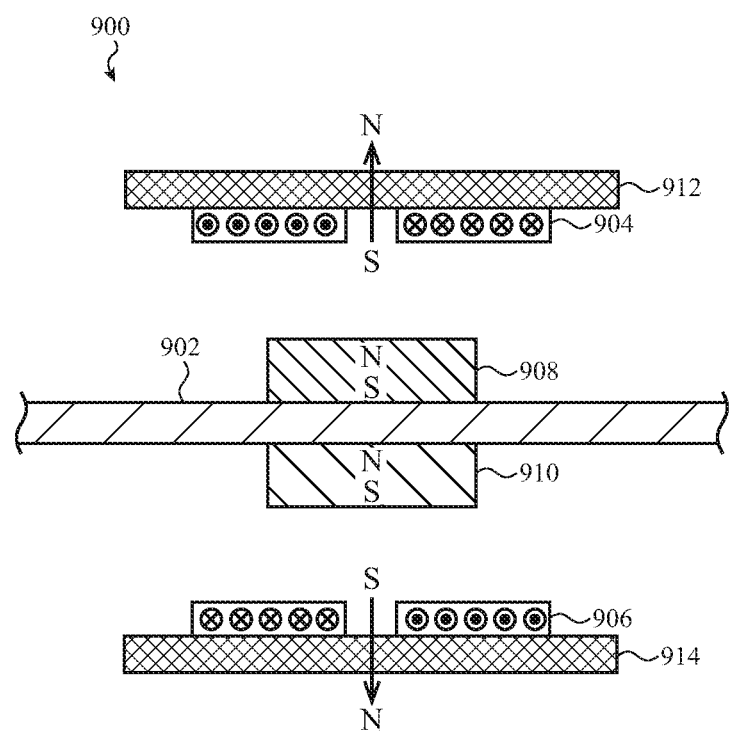
FIG. 9 illustrates a configuration of magnet structures on a piezoelectric structure and complementary electromagnets.

FIG. 9 is a cross-sectional illustration of part of a haptic actuator 900 using a two-sided piezoelectric structure 902. In the embodiment shown, two magnet structures 908 and 910 are attached to the two-sided piezoelectric structure 902, such as described in relation to FIG. 8.

Instead of ferritic plates being positioned near the magnet structures 908 and 910, the embodiment shown in FIG. 9 includes electromagnets 904 and 906, respectively attached to support components 912 and 914 that are stationary with respect to the electronic device. The electromagnets 904 and 906 are shown implemented as wire coils, such as described in relation to FIG. 7, but other implementations of electromagnets may be used.

It will be clear to one of skill in the art that an alternative of the embodiment of FIG. 9 would have a one-sided configuration, and having just the magnet structure 908 and the electromagnet 904 positioned on one side of the piezoelectric structure 902. In still other alternative embodiments, the electromagnet 904 may be replaced with a fixed magnetic element, such as a Halbach array.

The haptic actuator 900 may include a control unit configured to apply actuation signals to piezoelectric layers of the two-sided piezoelectric structure 902, and to control the currents in the electromagnets 904 and 906.

Controlling the currents through the electromagnets 904 and 906 allows for reversing the directions of their magnetic poles. Since the poles of magnet structures 908 and 910 are fixed, changing the direction of the magnetic poles of electromagnet 904, for example, allows for creating a repulsion force between magnet structure 908 and electromagnet 904, in addition to an attraction force. Creating such a repulsion force is not possible with the previous embodiments that use ferritic plates. A control unit may apply a de-actuation signal to a piezoelectric layer so that it expands or contracts appropriately to cause an additional repulsion force.

While in the previous embodiments the electromagnets 904 and 906 are shown attached to the support components 912 and 914, it is clear to one of skill in the art that in an alternate embodiment the electromagnets 904 and 906 could be attached to piezoelectric structure 902, and the magnet structures attached to the support components 912 and 914.

Figure 10:
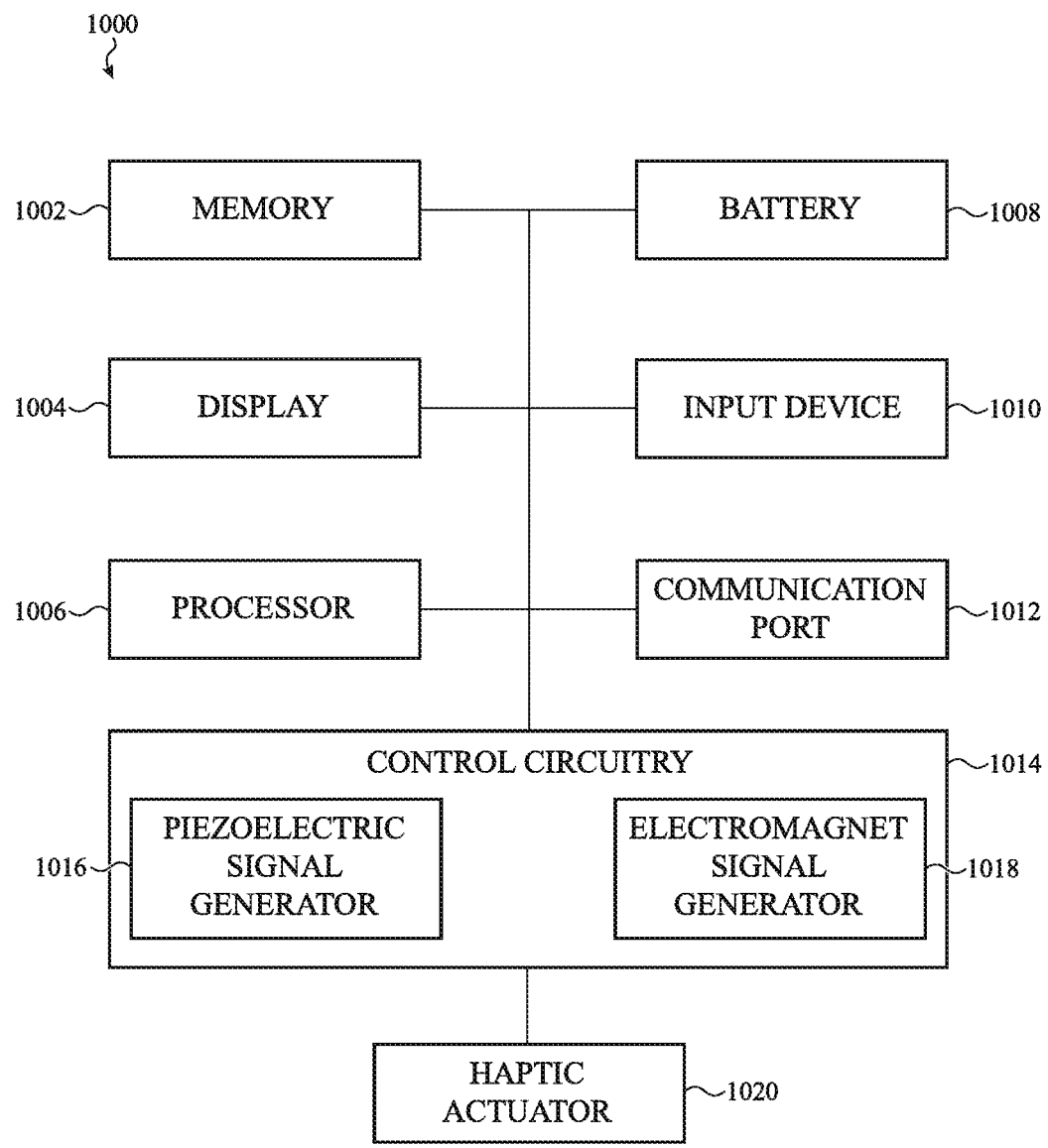
FIG. 10 shows a block diagram of components of an electronic device.

FIG. 10 is a block diagram of example components of an electronic device that may include a haptic actuator as described herein. The schematic representation depicted in FIG. 10 may correspond to components of the devices depicted in FIGS. 1-9, described above. However, FIG. 10 may also more generally represent other types of electronic devices with a haptic actuator that provides tactile or haptic responses at a surface.

As shown in FIG. 10, the electronic device 1000 includes a battery 1008 that is configured to provide electrical power to the components of the electronic device 1000. The battery 1008 may include one or more power storage cells that are linked together to provide an internal supply of electrical power. The battery 1008 may be operatively coupled to power management circuitry that is configured to provide appropriate voltage and power levels for individual components or groups of components within the electronic device 1000. The battery 1008, via power management circuitry, may be configured to receive power from an external source, such as an alternating current power outlet. The battery 1008 may store received power so that the electronic device 1000 may operate without connection to an external power source for an extended period of time, which may range from several hours to several days.

The electronic device 1000 also includes a processor 1006 operably connected with a computer-readable memory 1002. The processor 1006 may be operatively connected to the memory 1002 component via an electronic bus or bridge. The processor 1006 may be implemented as one or more computer processors or microcontrollers configured to perform operations in response to computer-readable instructions. The processor 1006 may include a central processing unit (CPU) of the device 1000. Additionally and/or alternatively, the processor 1006 may include other electronic circuitry within the device 1000 including application specific integrated chips (ASIC) and other microcontroller devices. The processor 1006 may be configured to perform functionality described in the examples above.

The memory 1002 may include a variety of types of non-transitory computer-readable storage media, including, for example, read access memory (RAM), read-only memory (ROM), erasable programmable memory (e.g., EPROM and EEPROM), or flash memory. The memory 1002 is configured to store computer-readable instructions, sensor values, and other persistent software elements.

In some embodiments, the electronic device 1000 includes one or more input devices 1010. The input device 1010 is a device that is configured to receive user input. The input device 1010 may include, for example, a push button, a touch-activated button, a touch-sensitive display (touch screen), or the like. In some embodiments, the input device 1010 may provide a dedicated or primary function, including, for example, a power button, volume buttons, home buttons, scroll wheels, and camera buttons.

In some embodiments, the electronic device 1000 also includes a display 1004 that renders visual information generated by the processor 1006. The display 1004 may include a liquid-crystal display (LCD), light-emitting diode, organic light-emitting diode (OLED) display, organic electroluminescent (EL) display, electrophoretic ink display, or the like. If the display 1004 is a liquid-crystal display or an electrophoretic ink display, the display may also include a backlight component that can be controlled to provide variable levels of display brightness. If the display 1004 is an organic light-emitting diode or organic electroluminescent type display, the brightness of the display 1004 may be controlled by modifying the electrical signals that are provided to display elements.

The electronic device 1000 may also include a communication port 1012 that is configured to transmit and/or receive signals or electrical communication from an external or separate device. The communication port 1012 may be configured to couple to an external device via a cable, adaptor, or other type of electrical connector. In some embodiments, the communication port 1012 may be used to couple the electronic device 1000 to a host computer.

The electronic device 1000 may include control circuitry 1014 configured to provide voltage, current, or other signals to the haptic actuator 1020. The haptic actuator 1020 may be as described above. The control circuitry 1014 may be implemented in a single control unit, and not necessarily as distinct electrical circuit elements. As used herein, "control unit" will be used synonymously with "control circuitry." The control circuitry 1014 may receive signals from the processor 1006, or from other elements of the electronic device 1000. Based on the received signals, the control circuitry 1014 can generate actuation signals to the haptic actuator 1020, such as to control piezoelectric elements and/or an electromagnet. The actuation signals generated by the control circuitry 1014 can be voltage signals, current signals, fiber optic signals, or another signal. The actuation signal may include the drive signal or voltage that is used to activate or actuate the piezoelectric layer or material. As examples, a voltage signal may be generated to cause a piezoelectric layer to deflect, and a current signal can be generated to flow through coils of an electromagnet. Thus, the control circuitry 1014 may include the electrical drivers or components required to produce such a drive voltage or current.

In some embodiments, the control circuitry can be implemented as amplifiers or buffers that modify the received signals from the processor 1006 or other devices. Additionally and/or alternatively, the control circuitry 1014 may receive digital signals from the processor 1006 or another element and have circuitry capable of generating analog input signals for the haptic actuator 1020.

The control circuitry 1014 may include two subcomponents: a piezoelectric signal generator 1016 and/or an electromagnet signal generator 1018. These may be implemented together, such as in a single integrated circuit, or as separate circuits. The piezoelectric signal generator 1016 produces an actuation signal, such as a voltage signal, that causes one or more piezoelectric layers to deflect. The electromagnet signal generator 1018 produces an actuation or activation signal, such as a current signal, to produce a particular magnetic field from an electromagnet.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
   an enclosure defining an interior volume and an exterior surface;
   a haptic actuator positioned within the interior volume and comprising:
      an elongated substrate having a first end that is fixed with respect to the enclosure and a second end that is free to move in an actuation direction that is transverse to a length of the elongated substrate;
      a piezoelectric layer attached to a side of the elongated substrate;
      a first magnetic element positioned proximate to a first side of the second end of the elongated substrate and offset from the elongated substrate, the first magnetic element fixed relative to the enclosure such that the first magnetic element remains stationary when the elongated substrate moves in the actuation direction; and
      a second magnetic element positioned proximate to a second side of the second end of the elongated substrate and offset from the elongated substrate, the second magnetic element fixed relative to the enclosure such that the magnetic element remains stationary when the elongated substrate moves in the actuation direction; and
   control circuitry configured to apply an actuation signal to the piezoelectric layer; wherein:
      in response to the actuation signal, the piezoelectric layer causes the elongated substrate to move along the actuation direction; and
      movement of the elongated substrate causes an actuator tab to contact an interior portion of the enclosure to produce a localized deflection along the exterior surface of the enclosure.

2. The electronic device of claim 1, wherein:
   the electronic device further comprises a touch-sensitive display positioned at least partially within the enclosure;
   the touch-sensitive display is configured to receive touch input; and
   the haptic actuator is configured to produce the localized deflection in response to the touch input.

3. The electronic device of claim 1, wherein the actuator tab is integrally formed with the elongated substrate.

4. The electronic device of claim 1, wherein:
   the haptic actuator further comprises a third magnetic element coupled to the elongated substrate and positioned at the second end of the elongated substrate; and
   the first magnetic element comprises a ferritic plate positioned proximate to the second end of the elongated substrate and separated from the third magnetic element by a gap.

5. The electronic device of claim 4, wherein the third magnetic element comprises a Halbach array oriented to have a face producing a strongest magnetic field directed toward the ferritic plate.

6. The electronic device of claim 4, wherein the piezoelectric layer is a first piezoelectric layer, the ferritic plate is a first ferritic plate, the gap is a first gap, and further comprising:
   a second piezoelectric layer attached to the elongated substrate opposite to the side of the elongated substrate with the first piezoelectric layer; and
   a second ferritic plate positioned proximate to the second end of the elongated substrate and separated from the second magnetic element by a second gap; wherein:
   in response to the actuation signal, the first piezoelectric layer and the second piezoelectric layer cause the elongated substrate to move along the actuation direction.

7. The electronic device of claim 6, wherein, in an absence of the actuation signal, the elongated substrate has a single stable equilibrium position that is substantially equidistant from the first ferritic plate and the second ferritic plate.

8. The electronic device of claim 6, wherein, in an absence of the actuation signal:
   the elongated substrate has a first stable equilibrium position when displaced towards the first ferritic plate, and
   the elongated substrate has a second stable equilibrium position when displaced towards the second ferritic plate.

9. The electronic device of claim 1, wherein:
   the electronic device includes a display;
   the enclosure includes a cover sheet positioned over the display and forming a portion of the exterior surface; and
   the localized deflection is along a surface of the cover sheet.

10. The electronic device of claim 1, wherein:
    the elongated substrate is one of an array of elongated substrates positioned parallel to each other, each having a first end fixed with respect to the enclosure and a second end that is free to move;
    a respective piezoelectric layer is positioned along a respective side of each elongated substrate of the array of elongated substrates;
    a respective magnetic element is positioned on each elongated substrate; and
    each elongated substrate of the array of elongated substrates is configured to cause a corresponding localized deflection at a respective location on the exterior surface of the electronic device.

11. An electronic device, comprising:
    an enclosure; and
    a haptic actuator positioned within the enclosure and comprising:
       an elongated substrate having a fixed end and a free end opposite to the fixed end, the free end being free to move in an actuation direction;
       an actuator tab positioned at the free end of the elongated substrate and extending in a direction that is transverse to a length of the elongated substrate;
       a piezoelectric layer coupled to the elongated substrate;
       a first ferritic plate coupled to a first side of the elongated substrate and positioned toward the free end of the elongated substrate;
       a second ferritic plate coupled to a second side of the elongated substrate and positioned toward the free end of the elongated substrate;
       a first magnet structure positioned near the free end and on the first side of the elongated substrate and separated from the first ferritic plate by a first gap, the first magnet structure fixed relative to the enclosure while the elongated substrate moves in the actuation direction;
       a second magnet structure positioned near the free end and on the second side of the elongated substrate and separated from the second ferritic plate by a second gap, the second magnet structure fixed relative to the enclosure while the elongated substrate moves in the actuation direction; and a control unit operatively coupled to the piezoelectric layer and configured to cause the elongated substrate to move along the actuation direction and cause the actuator tab to contact the enclosure to produce a tactile output along an exterior surface of the enclosure.

12. The electronic device of claim 11, wherein:
the control unit is configured to apply an actuation signal to the piezoelectric layer to cause the elongated substrate to move the first ferritic plate toward the first magnet structure; and
the control unit is configured to apply a de-actuation signal to the piezoelectric layer to cause the first ferritic plate to move away from the first magnet structure.

13. The electronic device of claim 11, wherein the actuator tab is integrally formed with the elongated substrate.

14. The electronic device of claim 11, wherein:
the piezoelectric layer is a first piezoelectric layer, and
the haptic actuator further comprises a second piezoelectric layer positioned on a side of the elongated substrate opposite to the first piezoelectric layer.

15. The electronic device of claim 14, wherein:
the control unit is configured to apply a first actuation signal to the first piezoelectric layer; and
the control unit is configured to apply a second actuation signal to the second piezoelectric layer.

16. The electronic device of claim 11, wherein:
the first magnet structure is an electromagnet;
the control unit controls a current through the electromagnet; and
a magnetic pole of the electromagnet is oriented toward the first ferritic plate.

17. An electronic device comprising:
an enclosure defining an interior volume and an exterior surface of the electronic device;
a display positioned at least partially within the interior volume; and
a haptic actuator positioned within the interior volume and comprising:
   an elongated substrate having a free end that is free to move along a nonlinear path;
   a piezoelectric layer positioned along a side of the elongated substrate;
   a first magnet structure coupled to a first side of the elongated substrate and positioned toward the free end of the elongated substrate;
   a second magnet structure positioned near the first side of the free end of the elongated substrate and separated from the first magnet structure by a first gap, the second magnet structure fixed with respect to the enclosure such that the second magnet structure remains stationary as the free end moves along the nonlinear path;
   a third magnet structure coupled to a second side of the elongated substrate and positioned toward the free end of the elongated substrate;
   a fourth magnet structure positioned near the second side of the free end of the elongated substrate and separated from the third magnet structure by a second gap, the fourth magnet structure fixed with respect to the enclosure such that the fourth magnet structure remains stationary as the free end moves along the nonlinear path; and
   a control unit configured to apply an actuation signal to the piezoelectric layer; wherein:
      in response to the actuation signal, the piezoelectric layer causes the free end of the elongated substrate to move along the nonlinear path to produce a tactile output along the exterior surface of the enclosure.

18. The electronic device of claim 17, wherein:
the second magnet structure is an electromagnet;
the control unit is configured to control a current in the electromagnet;
a magnetic pole of the first magnet structure is oriented toward the second magnet structure; and
a magnetic pole of the second magnet structure is oriented toward the first magnet structure.

19. The electronic device of claim 17, wherein:
the piezoelectric layer is a first piezoelectric layer and
the haptic actuator further comprises a second piezoelectric layer positioned on the elongated substrate opposite the first piezoelectric layer.

20. The electronic device of claim 19, wherein:
the fourth magnet structure is an electromagnet; and
the control unit is configured to apply a de-actuation signal to the second magnet structure and the fourth magnet structure such that:
   the first magnet structure is subjected to a first repulsion force by the second magnet structure; and
   the third magnet structure is subjected to a second repulsion force by the fourth magnet structure.

* * * * *